(12) United States Patent
Dunnavant

(10) Patent No.: US 9,055,696 B2
(45) Date of Patent: Jun. 9, 2015

(54) SYSTEMS FOR REMOVING HEAT FROM ENCLOSED SPACES WITH HIGH INTERNAL HEAT GENERATION

(75) Inventor: Bryan Keith Dunnavant, Lexington, VA (US)

(73) Assignee: MUNTERS CORPORATION, Selma, TX (US)

( * ) Notice: Subject to any disclaimer, the term of this patent is extended or adjusted under 35 U.S.C. 154(b) by 1188 days.

(21) Appl. No.: 12/929,104

(22) Filed: Dec. 30, 2010

(65) Prior Publication Data

US 2012/0171943 A1 Jul. 5, 2012

(51) Int. Cl.

| F25D 17/06 | (2006.01) |
|---|---|
| F25D 17/04 | (2006.01) |
| F25D 23/00 | (2006.01) |
| F24F 1/00 | (2011.01) |
| F24F 3/14 | (2006.01) |
| G06F 1/20 | (2006.01) |
| H05K 7/20 | (2006.01) |
| F28D 5/02 | (2006.01) |
| F28D 15/02 | (2006.01) |

(52) U.S. Cl.
CPC .............. *H05K 7/20745* (2013.01); *F28D 5/02* (2013.01); *F28D 15/02* (2013.01)

(58) Field of Classification Search
CPC ... F25D 17/065; F25D 17/042; F25D 23/003; F24F 1/0007; F24F 3/14; F24F 3/1405; G06F 1/20
USPC .............................................................. 62/89
See application file for complete search history.

(56) References Cited

U.S. PATENT DOCUMENTS

| 4,018,266 A | 4/1977 | Kay |
| 4,142,575 A | 3/1979 | Glancy |
| 4,538,426 A | 9/1985 | Bock |
| 4,562,955 A | 1/1986 | Horster et al. |
| 4,742,957 A * | 5/1988 | Mentuch ......................... 237/46 |
| 4,771,611 A | 9/1988 | McNab |
| 4,827,733 A | 5/1989 | Dinh |
| 4,887,438 A | 12/1989 | Meckler |

(Continued)

FOREIGN PATENT DOCUMENTS

| CN | Y-2748856 | 12/2005 |
| CN | A-101074851 | 11/2007 |

(Continued)

OTHER PUBLICATIONS

Mar. 29, 2013 Office Action issued in U.S. Appl. No. 12/929,102.

(Continued)

*Primary Examiner* — Alexandra Elve
*Assistant Examiner* — Larry Furdge
(74) *Attorney, Agent, or Firm* — Oliff PLC

(57) ABSTRACT

Systems are provided for cooling data centers based on a cooperative system including a plurality of Indirect Air-Side Economizers, also referred to as Recirculation Air Cooling Units, that are advantageously operated in conjunction with one or more Side Stream Filtration Units or filters inclusive to a portion of the IASE/RACUs, and one or more Make-Up Air Dehumidification/Humidification Units for the introduction of ventilation air and control of humidity within the enclosed space. An objective of the systems according to this disclosure is to provide the necessary rejection of heat, removal of particulate from the air, and control of the absolute moisture content of the air within a data center.

18 Claims, 16 Drawing Sheets

(56) References Cited

U.S. PATENT DOCUMENTS

| | | | |
|---|---|---|---|
| 4,987,952 | A | 1/1991 | Beal et al. |
| 5,076,065 | A | 12/1991 | Brogan |
| 5,309,725 | A | 5/1994 | Cayce |
| 5,426,953 | A | 6/1995 | Meckler |
| 5,435,382 | A | 7/1995 | Carter |
| 5,471,852 | A * | 12/1995 | Meckler ............... 62/271 |
| 5,531,800 | A | 7/1996 | Sewell et al. |
| 5,664,433 | A | 9/1997 | Bourne et al. |
| 5,813,135 | A | 9/1998 | Michie et al. |
| 5,826,443 | A | 10/1998 | Ares et al. |
| 5,860,284 | A | 1/1999 | Goland et al. |
| 6,050,100 | A | 4/2000 | Belding et al. |
| 6,131,653 | A | 10/2000 | Larsson |
| 6,347,527 | B1 | 2/2002 | Bailey et al. |
| 6,374,627 | B1 | 4/2002 | Schumacher et al. |
| 6,385,987 | B2 | 5/2002 | Schlom et al. |
| 6,497,107 | B2 | 12/2002 | Maisotsenko et al. |
| 6,523,604 | B1 | 2/2003 | Brooks et al. |
| 6,672,955 | B2 | 1/2004 | Charron |
| 6,776,001 | B2 | 8/2004 | Maisotsenko et al. |
| 6,854,278 | B2 | 2/2005 | Maisotsenko et al. |
| 6,868,693 | B2 | 3/2005 | Choi et al. |
| 6,878,334 | B2 | 4/2005 | Otter |
| 7,150,160 | B2 | 12/2006 | Herbert |
| 7,270,691 | B2 * | 9/2007 | Arts et al. ............... 55/385.2 |
| 7,322,205 | B2 | 1/2008 | Bourne et al. |
| 7,335,243 | B2 * | 2/2008 | Homan et al. ............... 55/385.2 |
| 7,398,821 | B2 | 7/2008 | Rainer et al. |
| 7,437,884 | B2 | 10/2008 | Otake et al. |
| 7,581,408 | B2 * | 9/2009 | Stark ............... 62/93 |
| 7,611,403 | B2 | 11/2009 | Wenger |
| 7,660,121 | B2 | 2/2010 | Campbell et al. |
| 7,765,827 | B2 | 8/2010 | Schlom et al. |
| 2001/0013404 | A1 | 8/2001 | Lagace et al. |
| 2002/0134544 | A1 * | 9/2002 | DeVilbiss et al. ............... 165/287 |
| 2003/0014983 | A1 | 1/2003 | Maisotsenko et al. |
| 2003/0051454 | A1 | 3/2003 | Yeung |
| 2004/0148956 | A1 | 8/2004 | Arshansky et al. |
| 2006/0054023 | A1 * | 3/2006 | Raetz et al. ............... 96/134 |
| 2007/0205297 | A1 | 9/2007 | Finkam et al. |
| 2008/0003940 | A1 | 1/2008 | Haglid |
| 2008/0022705 | A1 | 1/2008 | Clearman |
| 2008/0029250 | A1 | 2/2008 | Carlson et al. |
| 2008/0083237 | A1 | 4/2008 | Street et al. |
| 2008/0185446 | A1 | 8/2008 | Tozer |
| 2008/0203866 | A1 | 8/2008 | Chamberlain |
| 2008/0259566 | A1 | 10/2008 | Fried |
| 2008/0307806 | A1 | 12/2008 | Campbell et al. |
| 2009/0078401 | A1 | 3/2009 | Cichanowicz |
| 2009/0165485 | A1 | 7/2009 | Stark |
| 2009/0168345 | A1 | 7/2009 | Martini |
| 2009/0205416 | A1 * | 8/2009 | Campbell et al. ............ 73/202.5 |
| 2009/0207567 | A1 | 8/2009 | Campbell et al. |
| 2009/0210096 | A1 * | 8/2009 | Stack et al. ............... 700/278 |
| 2009/0223234 | A1 | 9/2009 | Campbell et al. |
| 2009/0228893 | A1 | 9/2009 | Behrendt et al. |
| 2009/0241578 | A1 | 10/2009 | Carlson et al. |
| 2009/0296342 | A1 | 12/2009 | Matteson et al. |
| 2010/0058778 | A1 | 3/2010 | Bhatti et al. |
| 2010/0146996 | A1 | 6/2010 | Campbell et al. |
| 2010/0149754 | A1 | 6/2010 | Chapel et al. |
| 2010/0154448 | A1 | 6/2010 | Hay |
| 2010/0170277 | A1 | 7/2010 | Schmitt et al. |

FOREIGN PATENT DOCUMENTS

| | | | |
|---|---|---|---|
| JP | A-02-004140 | | 1/1990 |
| JP | A-02-17341 | | 1/1990 |
| JP | A-10-318571 | | 12/1998 |
| JP | A-2002-206834 | | 7/2002 |
| JP | 2002317990 A | * | 10/2002 |
| JP | A-2002-317990 | | 10/2002 |
| RU | 2 177 115 C2 | | 12/2001 |
| WO | WO 2008/152416 A1 | | 12/2008 |

OTHER PUBLICATIONS

Jul. 7, 2014 Office Action issued in U.S. Appl. No. 12/929,102.
Nov. 12, 2013 Office Action issued in U.S. Appl. No. 12/929,102.
Oct. 9, 2013 Office Action issued in U.S. Appl. No. 12/929,103.
Mar. 3, 2014 Office Action issued in U.S. Appl. No. 12/929,105.
Apr. 10, 2014 Office Action issued in U.S. Appl. No. 12/929,103.
Torcellini et al., "Lessons Learned from Case Studies of Six High-Performance Buildings," Jun. 2006, Technical Report NREL/TP-550-37542. National Renewable Energy Laboratory.
Niu et al., "Raising Evaporative Cooling Potentials Using Combined Cooled Ceiling and High Temperature Cooling Storage," Jul. 27-30, 2009, pp. 2169-2176, Glasgow Scotland. Eleventh Int'l IBPSA Conf., Building Simulation.
New U.S. Patent Application.
Translation of "Menerga at Chillventa 2010: New air conditioning units for the air out of data center cooling," Nuremberg/Mülheim an der Ruhr, Oct. 13, 2010; 2 pgs.
GC-DC—Key Features GC-DC Concept, 1 pg. (www.deernsamerica.com/datacenters/gcdc/?cid+1166).
Aug. 15, 2014 Office Action issued in U.S. Appl. No. 12/929,103.

* cited by examiner

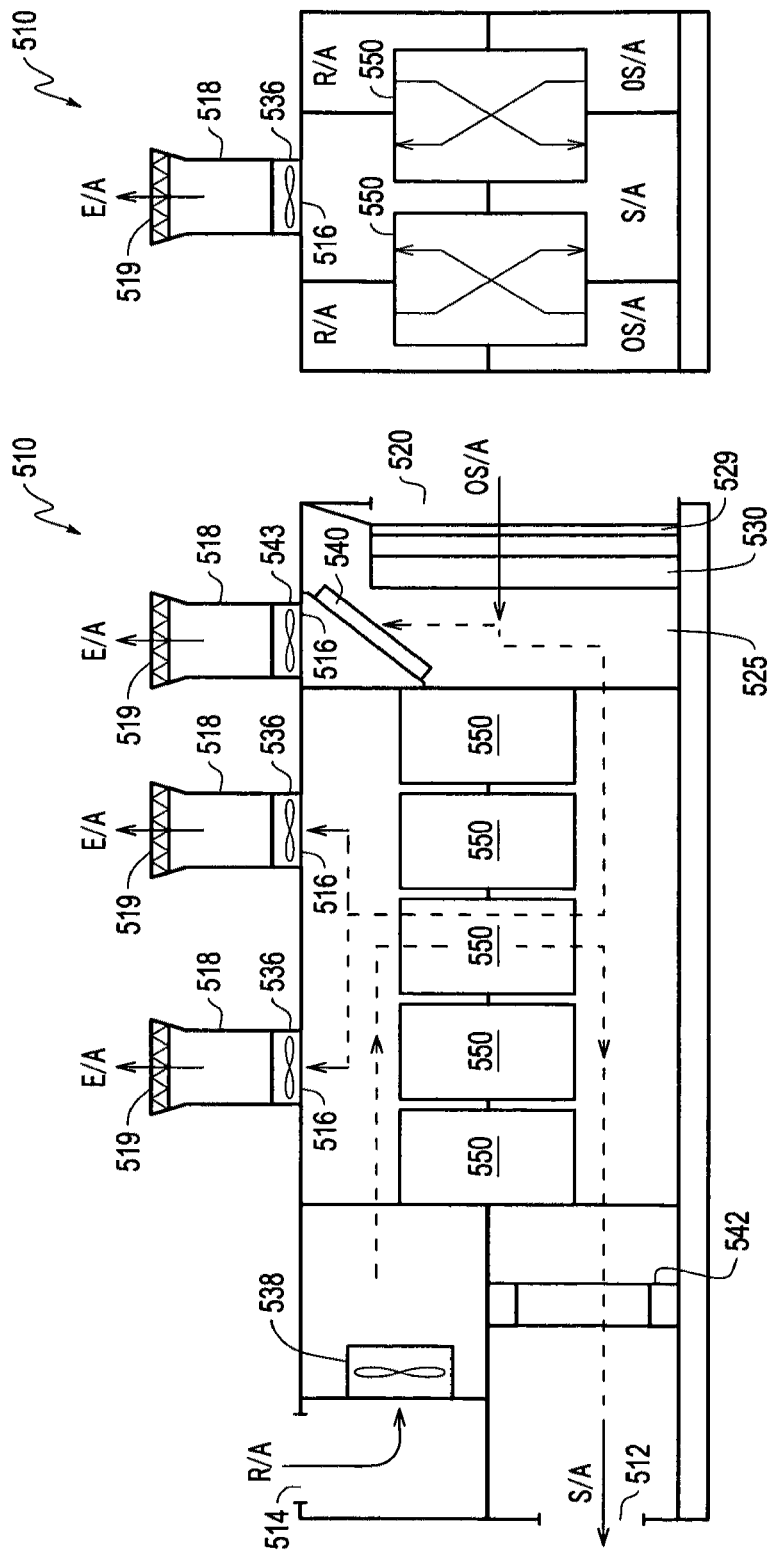

SYSTEMS FOR REMOVING HEAT FROM ENCLOSED SPACES WITH HIGH INTERNAL HEAT GENERATION

This application is related to, and shares a common disclosure with, U.S. patent application Ser. No. 12/929,105 filed Dec. 30, 2010, U.S. patent application Ser. No. 12/929,102 filed Dec. 30, 2010, and U.S. patent application Ser. No. 12/929,103 filed Dec. 30, 2010.

BACKGROUND

This disclosure is directed to systems and methods for removing heat from recirculated air from an enclosed space, particularly from a data center, in an efficient and effective manner.

Data centers include data servers and other ancillary equipment. The data centers draw significant amounts of power and generate significant amounts of heat. Cooling the data centers, particularly as they have increased in size and electronic capacity, has become an increasing challenge. Cooling the data centers economically is an even greater challenge.

Computer servers have typically been cooled by air-conditioned, refrigerated air that is delivered into the data centers by all available means, including through the elevated flooring, to individually cool each computer server. The requirement for providing 55° F. to 65° F. refrigerated cold air was understood industry wide based on the need to minimize the potential for hot spots within the data servers. Providing the required amount of refrigerated cold air, as the server banks increased in size, proved increasingly costly and complex.

Creative air management methodologies have been undertaken to remove the generated heat in a more efficient manner. These include construction of specific air pathways with segregated, enclosed cold air supply aisles ("cold aisles") and separate hot air return aisles ("hot aisles") within data centers in an attempt to keep from commingling cold air with hot air in an open space. Such construction aids in providing necessary cooling capacity more economically and reduces the potential for server hot spots.

A significant change to the parameters for cooling data centers was realized when the industry determined that warmer server inlet conditions for Class I and II data centers was acceptable. That, combined with advances in hot and cold aisle containment systems and designs, permits data center cooling units to deliver warmer air to cool the servers than previously thought possible. In 2008, an expanded envelope for air conditions entering the servers in data centers was approved, bringing the maximum recommended server inlet temperature up to 80.6° F. The above change in recommended inlet air temperature for the data servers caused engineers to seek new energy efficient solutions to manage the thermal loads in the data centers.

An objective is to provide inlet air to the servers at a temperature that is within the recommended range while consuming the least amount of total power. A number of methodologies have been attempted. Some of these methodologies are discussed briefly below. Prior to a discussion of any individual methodology, however, it should be noted that any air cooling solution for data centers should also provide for humidity control of the space in order to limit the negative effects of extreme humidity deviations within the space. Also, the air flow cannot be on a completely closed loop because, even in the cleanest data center environment, operation of the data servers themselves creates certain byproducts that need to be diluted with some minimum level of ventilation air and/or filtered out of the air flow on a routine basis.

The following is a non-exhaustive list of methodologies that have been attempted.

Air-Side Economizers (ASEs) simply deliver outdoor air, mixed with return air when required to achieve the target air delivery temperature, when ambient conditions favor free cooling, through the data center. A shortfall of ASEs, however, is that they cannot generally be used under hot or humid ambient conditions. Thus, un-augmented ASEs provide little ability to reduce the necessary size of supplemental refrigeration-based cooling and offer no reduction in peak electrical load. Use of ASEs also often leads to wide swings in space humidity unless humidification control systems are employed.

Direct Evaporative Cooling (DEC) can be used to complement ASEs to extend the operating envelope of ambient conditions for the ASEs.

Separate Water-Side Economizers may be used in which cooling towers or fluid coolers are employed in a variety of design configurations to reject some or all of the heat from the data center in combination with refrigeration-based cooling.

Various combinations of the above methods have been attempted.

Finally, Liquid-Cooled Enclosures, sometimes referred to as in-row or in-rack cooling, may be provided in which cool water produced from a combination of chillers and cooling towers, or otherwise by refrigerants, is pumped to heat changers or cold plates installed directly within server racks.

While these systems result in energy savings compared to traditional 100% refrigeration-based approaches, each is less than ideal. Among the shortfalls of these systems are: (1) the need to include substantial pre-filters and post filters, particularly on systems implementing ASEs; (2) the need to modulate damper systems and relief fans or barometric dampers and pressure controls on any system that introduces outdoor air directly into the data center; (3) ongoing extensive reliance on chilled water and/or condenser water piping or refrigerant piping; (4) redundant pumps; and (5) other additional support systems. These systems are often maintenance intensive.

SUMMARY

It would be advantageous, in view of the above discussion, to provide an efficient and economical cooling system for a data center based on rejecting the heat from 100% recirculation air from the data center, and delivering the air at 75° F. to 80.6° F. (or warmer as allowed by the servers utilized within the data center, and as necessary to minimize overall electrical power consumption).

The systems and methods according to this disclosure provide a unique capability using Indirect Evaporative Cooling technology to provide recirculated clean, humidity-controlled, cooled air to the inlets of servers in a data center.

The systems and methods according to this disclosure provide a plurality of Indirect Air-Side Economizers (IASEs) that include air-to-air heat exchangers.

In general, the systems and methods according to this disclosure are intended, among other objectives, to: (1) reduce refrigeration capacity under all ambient conditions in most climates; (2) reduce the need for filtration of the air used in the heat rejection process, and (3) eliminate modulating dampers and complex controls, while cooling the hot aisle air from the data center to a target air delivery temperature using little or no supplemental refrigeration based cooling for most annual operating hours in most environments.

The systems and methods according to this disclosure will tend to avoid attendant shortfalls of, for example, introducing air pollutants from outdoor air into the data center by the heat rejection equipment, or otherwise introducing outdoor air with extreme high or low humidity levels that could accelerate corrosion of circuit boards or lead to short circuiting or electrostatic discharge concerns within the data center.

The systems and methods according to this disclosure operate in coordination with data centers configured according to available technologies to include cold air corridors/galleries or cold aisles, and hot air plenums or hot aisles, as discussed briefly above, that are segregated from each other within the data center.

The systems and methods according to this disclosure provide multiple IASE cooling units, as required to reject the heat load and meet the redundancy requirements, that provide supply air to the cold aisles of the data center at the target air delivery condition and recover return air from the hot aisles for heat removal and recirculation via the multiple IASE cooling units.

The systems and methods according to this disclosure provide for a volumetric flow of air produced by multiple IASE cooling units at a rate as required to reject the heat load generated by the servers with the operating temperature difference between the hot and cold aisles. The volume of air moved by the multiple IASE cooling units may be as much as 200 or more air exchanges in the data center per hour.

The systems and methods according to this disclosure may include a separate Side Stream Filtration Unit (SSFU) in which one or more filtration units is provided to limitedly filter the recirculating air within the data center. The SSFU is designed and sized specifically to circulate a portion of the recirculating air, for example, at a rate of 6 to 10 exchanges of air per hour, through the SSFU and back to the return or supply air within the data center.

The systems and methods according to this disclosure may include a separate Make-Up Air/Humidification Unit (MUA/HU) and Make-Up Air Dehumidification/Humidification Unit (MUAD/HU) by which ventilation air is introduced into the overall air handling path in the data center, either directly or via the SSFU. The MUA/HU or MUAD/HU need only operate at a rate to introduce appropriately humidified or dehumidified ambient air into the overall air-handling path at a rate as required to achieve good air quality, humidity, and pressure control. This amount may be as little as 0.25 air exchanges per hour.

The systems and methods according to this disclosure substantially eliminate the need for extensive filtering of the recirculated air. This limits, for example, the extent to which the SSFU needs to be present to provide filtration capacity. A benefit of the systems and methods according to this disclosure is this reduction in filtration requirements, and the associated impact on supply fan motor power and maintenance costs. In the systems and methods according to this disclosure filters and/or filtration units are limitedly provided, as appropriate, in the SSFU or otherwise, that do not impede the total volumetric flow rate of air through the data center, while providing a necessary level of filtration specifically sized to afford appropriate particulate removal in the overall air handling system. Specifically, the quantity of filters is often reduced by a factor of 10 or so, but the degree of filtration may be improved by utilizing a higher efficiency filtration methodology.

The systems and methods according to this disclosure include IASEs, also referred to interchangeably as Recirculation Air Cooling Units (RACUs), that may specifically improve upon conventional indirect evaporative cooling systems by providing preferably one of an engineered polymeric tube-type air-to-air heat exchanger, a counter-flow, plate-type air-to-air heat exchanger, various combinations of cross flow plate-type heat exchangers, or heat pipe type air-to-air heat exchangers. In this regard, the systems and methods according to this disclosure may provide additional heating/cooling, humidification/dehumidification and air handling components within one or more of the IASEs/RACUs, the SSFU, or the MUA/HU or MUAD/HU as may be required by, or appropriate to, a specific geographic, and therefore, climatological location of the data center.

The systems and methods according to this disclosure also provide a control scheme for controlling the temperature of the air supplied to the data center by controlling the mass flow rate of scavenger air (ambient cooling air) drawn through the side of the heat exchanger opposite that of the recirculating air from the data center, based on ambient conditions. With a polymeric-tube type air-to-air heat exchanger in the IASE/RACU, for example, outdoor scavenger air is drawn across the exterior of tubes which are wetted by recirculation or once-thru water systems. With scavenger air flowing over the wet exterior tube surfaces, evaporative heat transfer efficiently cools the data center hot aisle air flowing through the inside of the tubes. The heat rejection process may be controlled by varying the speed of the scavenger fan(s), and may include staging fans in concert with speed modulation to minimize overall power consumption. The result is an energy efficient heat rejection process that is simple to control.

These and other features and advantages of the disclosed systems and methods are described in, or apparent from, the following detailed description of various exemplary embodiments.

BRIEF DESCRIPTION OF THE DRAWINGS

Various exemplary embodiments of the disclosed systems and methods for providing efficient and economical cooling for a data center will be described, in detail, with reference to the following drawings, wherein:

FIG. 4 illustrates a schematic diagram of a second exemplary embodiment of an IASE/RACU according to this disclosure;

FIG. 5 illustrates a cross-section depicting a sample counter flow air flow of the air in the plate-type heat exchanger depicted in the second exemplary embodiment of the IASE/RACU shown in FIG. 4;

DETAILED DESCRIPTION OF EMBODIMENTS

Figure 1:
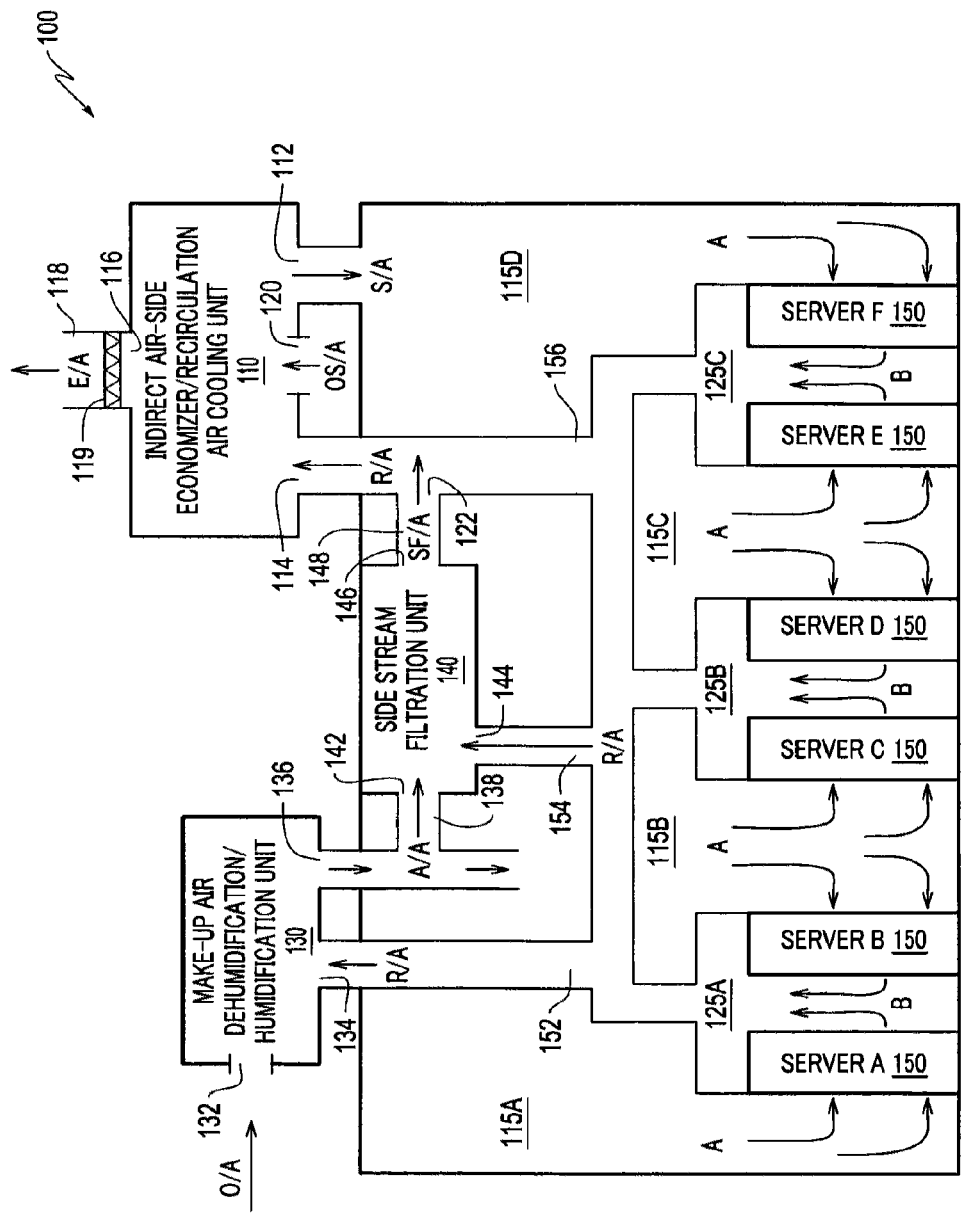
FIG. 1 illustrates a schematic diagram of an exemplary overall data center cooling system according to this disclosure.

The systems and methods for providing efficient and economical cooling air capabilities to data centers according to this disclosure will generally refer to this specific utility for those systems and methods. The exemplary embodiments described and depicted in this disclosure should not be interpreted as being specifically limited to any particular configuration, or to any particular intended use. In fact, any high heat-producing environment that would benefit from an air flow cooling system according to the systems and methods of this disclosure is contemplated.

The principles of indirect evaporative cooling technology, as is used in the disclosed embodiments of the Indirect Air-Side Economizers/Recirculation Air Cooling Units (IASEs/RACUs) described in this disclosure will be briefly discussed. In the disclosed IASE/RACU installation, outdoor scavenger air (OS/A) enters the IASE/RACU through an inlet and flows through one side of an air-to-air heat exchanger, the OS/A—E/A (exhaust air) side. Warm return air (R/A) from the environment which the IASE/RACU supports such as, for example, a data center, and specifically the return air from a hot aisle, enters the IASE/RACU from another inlet and flows separately through an opposite side of the air-to-air heat exchanger, the R/A—S/A (supply air) side. The R/A—S/A side and the OS/A—E/A side are completely separated from one another by one of a number of different methodologies. These methodologies may include sealed heat exchanger plates and/or sealed heat exchanger tubing, or separating partitions. As the hot aisle R/A flows through the air-to-air heat exchanger, it transfers its heat to the cooler OS/A through the surface that completely separates and segregates the two airstreams. The OS/A may be used at its ambient temperature, or may be otherwise evaporatively cooled, either prior to entering the air-to-air heat exchanger or by direct spray of water onto the OS/A—E/A surfaces of the heat exchanger. Use of evaporative pre-cooling may enhance the heat rejection potential, particularly in instances where the OS/A has a Wet-Bulb Depression (WBD, which is a difference between the dry-bulb and wet-bulb temperature) of 10° F. or more. A water-side economizer coil, piped to an external cooling tower, may be installed, for example, upstream of the direct evaporative cooler, providing additional cooling for the OS/A and associated heat rejection. Such a combined Indirect-Direct-Indirect cycle may likely be only used in extreme cases because such an apparatus would reduce the cost benefit of the un-augmented IASE/RACU.

By selecting a heat exchanger with an effectiveness of, for example, 80%, and employing a 95% efficient direct evaporative pre-cooler, most of the heat generated from a data center may be efficiently and economically rejected to ambient air through the heat exchanger of the IASE/RACU, even during hot and humid ambient conditions. Given a 100° F. hot aisle temperature, and a 75° F., target cold aisle temperature, whenever an outdoor air dry-bulb temperature is 68.4° F. or lower, the IASE/RACU cycle can reject 100% of the heat generated by the data center. This is true even in consideration of a temperature rise (nominally 1.5° F.) across the recirculating fans in the IASE/RACU. Similarly, when a 95% efficiency OS/A evaporative pre-cooler is included, 100% of heat generated by the data center may be rejected by the augmented IASE/RACU if the ambient wet-bulb temperature is 65° F. or lower, regardless of how hot the corresponding ambient dry-bulb temperature may be.

Exemplary computations are shown below in Table 1 for an example 80% effective counter flow plate-type heat exchanger, IASE/RACU system cooling a 200 kW IT load.

TABLE 1

| Scavenger Air Entering HX | | | Scavenger Air | HX Pressure Drop | |
| --- | --- | --- | --- | --- | --- |
| Dry-Bulb (° F.) | Wet-Bulb (° F.) | Flow CFM | Leaving HX Dry-Bulb (° F.) | Scavenger-Side inches-wc | Supply Air Leaving HX* Dry-Bulb (° F.) |
| 90 | 85 | 28000 | 98.5 | 0.61 | 92.4 |
| 80 | 78 | 28000 | 95.7 | 0.63 | 84.4 |
| 70 | 69 | 28000 | 92.8 | 0.65 | 76.3 |
| 65 | 64 | 22500 | 94.4 | 0.44 | 75 |
| 60 | 59 | 18100 | 96.3 | 0.30 | 75 |
| 50 | 49 | 13350 | 98.3 | 0.18 | 75 |
| 40 | 39 | 10665 | 99.3 | 0.12 | 75 |
| 30 | 29 | 8875 | 99.9 | 0.09 | 75 |
| 20 | 19 | 7580 | 100.3 | 0.07 | 75 |
| 10 | 9 | 6585 | 100.6 | 0.06 | 75 |
| 0 | −1 | 5800 | 100.8 | 0.05 | 75 |
| −10 | −11 | 5160 | 100.9 | 0.04 | 75 |
| −20 | −20.5 | 4625 | 101.0 | 0.03 | 75 |
| −30 | −30.5 | 4175 | 101.1 | 0.03 | 75 |

Supply Airflow entering HX = 26,760 ACFM
HX Pressure Drop (Supply-Side) = 0.56 inches-wc
*Scavenger Air Flow Controlled to Maintain Target Supply Air Dry-Bulb = 75° F.

It should be noted that the required OS/A flow decreases rapidly with decreasing ambient dry-bulb entering temperature. At, for example, an ambient dry-bulb temperature of only 50° F., the OS/A flow drops by more than 50% (to 13,350 CFM) from a designed OS/A flow. This allows for a reduction in the outdoor scavenger fan motor power to approximately 12% of its design maximum.

Table 2 below shows, for various U.S. cities, the annual hours in a typical year where an 80% effective plate-type heat exchanger augmented with a 95% efficient scavenger air evaporative pre-cooler can cool hot aisle air, after fan heat, from 101.5° F. to 75° F.

TABLE 2

| City | Hours | % of Annual Hrs |
|---|---|---|
| Albuquerque, NM | 8759 | 99.99% |
| Atlanta, GA | 6943 | 79.26% |
| Baltimore, MD | 7416 | 84.66% |
| Boise, ID | 8760 | 100.00% |
| Boston, MA | 8302 | 94.77% |
| Chicago, IL | 8085 | 92.29% |
| Boulder, CO | 8759 | 99.99% |
| Fort Worth, TX | 5937 | 67.77% |
| Las Vegas, NV | 8474 | 96.74% |
| Los Angeles, CA | 8697 | 99.28% |
| Minneapolis, MN | 8104 | 92.51% |
| Phoenix, AZ | 7391 | 84.37% |
| Portland, OR | 8742 | 99.79% |
| Salt Lake City, UT | 8758 | 99.98% |
| San Francisco, CA | 8755 | 99.94% |
| Seattle, WA | 8755 | 99.94% |

* allows for 1.5° F. of fan heat

The systems and methods according to this disclosure are designed and implemented with the above parameters in mind.

A. Overall System Configuration

For consistency, throughout this disclosure, the different depicted air flows will be referred to as: (1) supply air (S/A), which is the cooled air output from the IASE/RACU to the cold aisles of the data center; (2) return air (R/A), which is the air returned to the IASE/RACU from the hot aisles in the data center; (3) outdoor scavenger air (OS/A), which is the air input to the IASE/RACU from outside to the air-to-air heat exchanger in the IASE/RACU; and (4) exhaust air (E/A), which is the air forcibly exhausted from the IASE/RACU as the OS/A has passed through the air-to-air heat exchanger for heat extraction. It should be noted that OS/A will also be input to the Make-Up Air/Humidification Unit (MUA/HU) or Make-Up Air Dehumidification/Humidification Unit (MUAD/HU). For completeness, reference will be made to auxiliary air (A/A) output from the MUA/HU or MUAD/HU either directly into the room or to the Side Stream Filtration Unit (SSFU) and supplemental filtered air (SF/A) output from the SSFU into a flow path including R/A to be supplied as an augment to the R/A returning to the IASE/RACU.

FIG. 1 illustrates a schematic diagram of an exemplary overall data center cooling system according to this disclosure. As shown in FIG. 1, a system for removing heat from a data center 100 includes several integrated components. These components include, for example, a plurality of IASEs/RACUs 110, at least one MUAD/HU 130 and at least one SSFU 140. The combination of these units controls the flow of S/A to the cold aisles 115A-D in the data center to support cooling, particulate removal, dilution of room generated contaminants by introducing filtered ventilation air, and humidity control of the individual data servers 150A-F.

In FIG. 1, S/A provided to the cold aisles 115A-D is forced through the data servers 150A-F (see Arrows A entering the data servers and Arrows B leaving the data servers) where the cooled S/A absorbs heat and exits the data servers into hot aisles 125A-C as R/A. The R/A is then generally passed through a collecting manifold in the hot aisle system back toward the IASE/RACU units 110 generally along a path depicted as 156 in FIG. 1, which may constitute a plenum or duct system. The R/A enters the IASE/RACU 110 through an inlet opening 114 that may include a damper (not shown) for controlling flow of the R/A to the IASE/RACU 110 and/or for isolating the system during maintenance.

Specific operation of the IASE/RACU 110 will be discussed in detail below. For the purposes of this overview, OS/A enters the IASE/RACU 110 via an inlet opening, or openings, 120 that also may include an intake hood, filter, and/or damper (not shown). As will be seen in FIG. 2, OS/A then passes through an air-to-air heat exchanger where it cools the R/A flowing thru the other side of the air-to-air heat exchanger and exits the air-to-air heat exchanger as E/A via an outlet opening 116 that also may include a damper 119 and an exhaust port, pipe or stack 118. As will be seen in a detailed description of the various embodiments of IASEs/RACUs discussed below, a scavenger heat removal fan, or fans, is placed in the OS/A—EA side to control the movement of the OS/A from the inlet opening 120 through the air-to-air heat exchanger, where it becomes E/A, to the outlet opening 116 and out the optional exhaust port, pipe or stack 118. Each scavenger heat removal fan may include a damper 119. The exhaust port, pipe or stack 118 may be integral to the exhaust fan, as is typical of vane or tube-axial type fans.

Separately, R/A enters the IASE/RACU 110 via inlet opening 114 that may also include a damper (not shown), the R/A passing through the air-to-air heat exchanger, which will be described in detail below. The R/A is cooled from non-commingled flow with the OS/A in the air-to-air heat exchanger and exits the air-to-air heat exchanger, and the IASE/RACU 110, as cold S/A via outlet opening 112, that may include a damper, to be supplied to the cold aisles 115A-D in the data center 100.

A number of IASEs/RACUs 110, of a specified air handling (throughput) capacity, may be selected to optimize the flow of S/A through the data center according to the above-discussed parameters and the method discussed below, which include, for example, volumetric movement of the air, in the S/A (see Arrows A in FIG. 1)—R/A (see Arrows B in FIG. 1) cycle through the data servers, and overall through the system at a rate of as much as 200 or more air exchanges per hour.

A Make-Up Air Dehumidification/Humidification Unit (MUAD/HU) 130 may be provided to input A/A into the system at a specified fixed or variable rate. In the MUAD/HU 130, as will be described in greater detail below, OS/A enters through an inlet opening 132, and is filtered and/or humidified/dehumidified, as appropriate. The OS/A is then forced by a circulating fan through outlet opening 136 to, for example, conduit 138 leading to the Side-Stream Filtration Unit (SSFU) 140 that will be discussed below, or otherwise directly into the room. A R/A pickup 152 for R/A may be included to provide R/A via an inlet opening 134 of the MUAD/HU 130. R/A is used where heat may be required for efficient operation of the humidification process of the MUAD/HU 130. The ventilation rate for air entering inlet opening 132 of the MUAD/HU 130 to be supplied as A/A to the system will generally be at a relatively minimal rate as low as approximately 0.25 air exchanges per hour.

A Side Stream Filtration Unit (SSFU) 140 may be provided to filter the R/A entering through an inlet 144. It may also be installed to provide additional polishing filtration to A/A, introduced by the MUAD/HU 130, prior to delivery into the data center. In the SSFU 140 shown in FIG. 1, A/A from the MUAD/HU 130 enters via an inlet opening 142 from conduit 138 in concert with R/A that enters via one or more inlet openings 144 via one or more conduits or plenums 154, and passes through one or more filters being forced by a separate circulating fan in the SSFU 140 (that will be discussed in detail below), prior to exiting the SSFU 140 via an outlet opening 146 as SF/A. Outlet opening 146 from the SSFU 140 may include a conduit 148 to the R/A path 156 so that the SF/A can be mixed with the R/A prior to the R/A entering the IASE/RACU 110 via inlet opening 114.

A purpose of the SSFU 140 is to remove impurities that are generated within the data servers 150A-F, or other airborne impurities or pollutants that are entrained in the RIA stream in an effort to remove impurities from the R/A and, when so installed, to provide polishing filtration of the ventilation air. The turnover rate of air passing through the SSFU 140 according to the R/A path is preferably at a rate of approximately 6 to 10 exchanges per hour, significantly less than the air turnover rate required to reject heat from the data center.

With the above general overview of the disclosed overall air handling system, individual components of the overall air handling system will be discussed in detail with reference to exemplary embodiments below.

B. Indirect Air-Side Economizer/Recirculation Air Cooling Unit (IASE/RACU)

Figure 2:
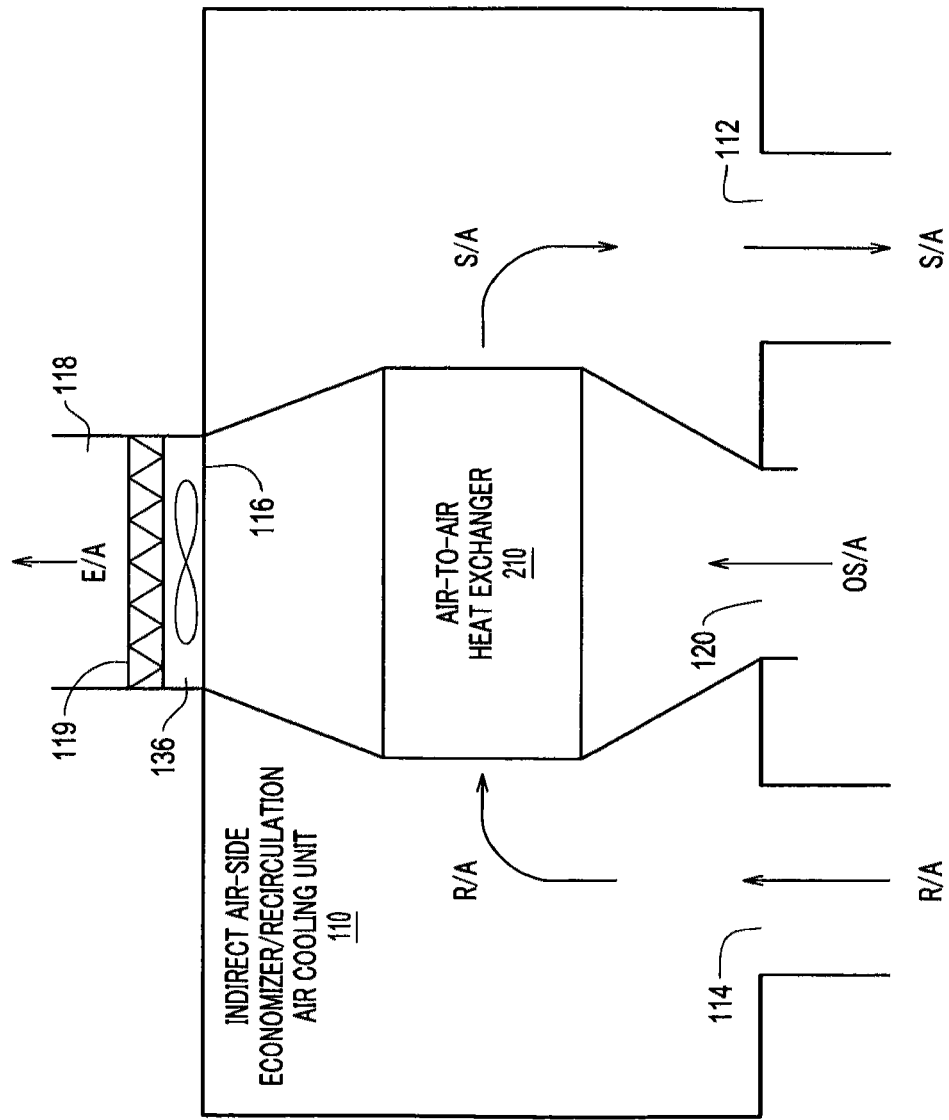
FIG. 2 illustrates a basic block diagram of an Indirect Air-Side Economizer (IASE) or Recirculation Air Cooling Unit (RACU) according to this disclosure.

FIG. 2 illustrates a basic block diagram of an Indirect Air-Side Economizer (IASE) or Recirculation Air Cooling Unit (RACU) according to this disclosure. FIG. 2 reveals the IASE/RACU 110 shown in FIG. 1 in greater detail. As explained above, R/A flows in through inlet opening 114 toward an air-to-air heat exchanger 210 while OS/A flows through inlet opening 120 toward air-to-air heat exchanger 210. Air-to-air heat exchange occurs in air-to-air heat exchanger 210 according to a number of different methodologies that will be discussed as specific embodiments below. The R/A cooled by the air-to-air heat exchanger 210 exits the air-to-air heat exchanger 210 and exits the IASE/RACU 110 via outlet opening 112 to the cold aisles 115A-D (shown in FIG. 1). The OS/A is drawn through air-to-air exchanger 210 and exits the air-to-air heat exchanger 210 as E/A, exiting the IASE/RACU 110 via outlet opening 116 and optional exhaust port, pipe or stack 118, which may be integral to an exhaust fan 136 and may also include a damper 119.

As will be described in greater detail below, plate-type air-to air heat exchangers, heat pipe air-to air heat exchangers and polymeric tube cross-flow air-to-air heat exchangers are optimal candidates for use in the IASE/RACU applications of this disclosure. Advantages include (1) lack of measurable leakage when used according to this application, (2) no moving parts in the air-to-air heat exchanger unit itself, (3) relatively low maintenance requirements as compared to other more complex cooling systems designs, and (4) an ability to be specifically designed for increased efficiency based on their (a) ease of design and construction and (b) compatibility with a wide array of support unit requirements. Finally, it should be recognized that such air-to-air heat exchangers can be designed and constructed with a variety of flow patterns, not limited to the specific exemplary embodiments of flow patterns that are described and depicted in this disclosure. Structures and configurations may be implemented that prove particularly favorable to cooling a broad spectrum of data center architectures.

Figure 3:
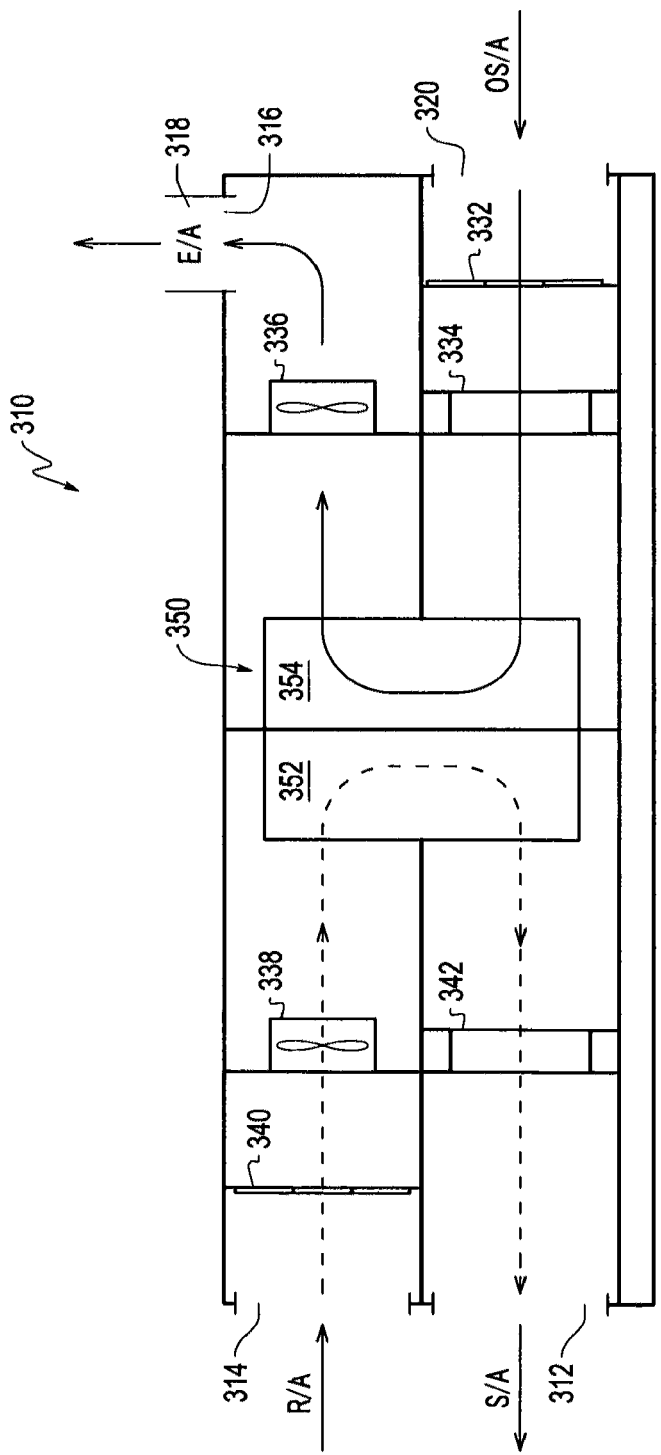
FIG. 3 illustrates a schematic diagram of a first exemplary embodiment of an IASE/RACU according to this disclosure.

FIG. 3 illustrates a schematic diagram of a first exemplary embodiment of an IASE/RACU 310 according to this disclosure. As shown in FIG. 3, IASE/RACU 310 may include, for example, an R/A inlet opening 314 through which R/A enters the IASE/RACU 310. A filter 340 may be provided to filter the R/A, either before or after the R/A passes through circulating fan, or fans, 338. Movement of the R/A through the circuit between inlet opening 314 and outlet opening 312 is facilitated and forced by circulating fan(s) 338. R/A is forced by the circulating fan(s) 338 through one side 352 of the air-to-air heat exchanger 350. The circulating fan(s) 338 is placed in the R/A side of this cycle because the circulating fan(s) 338 will introduce additional heat into the moving air in the R/A S/A side 352 of the cycle, and much of this heat may be extracted thru the air-to-air heat exchange process. Further, installing the circulating fan(s) 338 in this blow-thru arrangement results in the air-handling system being under positive pressure relative to ambient. This positive pressure in the system reduces the potential for dust or other particulate matter entering the R/A tunnel thru doors or other points of access. Typically, a circulating fan 338, because of air compression and motor inefficiencies, raises the temperature of the R/A pushed through it by 1.5° F. or more. The R/A is cooled in the R/A—S/A side 352 of the air-to-air heat exchanger 350 and exits the air-to-air heat exchanger 350 as S/A via outlet 312. An additional cooling coil 342 may be provided to further cool the S/A as appropriate to the specific installation of the IASE/RACU 310. Through the action of the circulating fan(s) 338, cool S/A is forced to exit the IASE/RACU 310 via outlet opening 312 toward the cold aisles 115A-D of the data center (as shown in FIG. 1). The speed of circulating fan(s) 338 is controlled to optimize total power consumption while achieving the desired heat rejection. The method for control may involve maintaining a slight positive pressure gradient from server rack inlet to outlet and/or achieving the target hot-aisle temperature while ensuring that there are no excessive spikes in air temperature entering the data servers, or preferably, having the speed signal derived from the IT equipment.

Separately, in the IASE/RACU 310, OS/A is drawn through inlet opening 320 by the action of scavenger fan, or fans, 336. IASE/RACU 310 may include an intake hood (not shown) and filter 332 to filter the OS/A early in the cycle in this side of the IASE/RACU 310. The filter 332 may work in conjunction with, or separately from, a direct evaporative pre-cooler 334 that may be included in the OS/A path toward the air-to-air heat exchanger 350. OS/A, filtered and pre-cooled as appropriate, is then drawn through the OS/A—E/A side 354 of the air-to-air heat exchanger 350 by the operation of scavenger fan, or fans, 336. Again, the scavenger fan(s) 336 is placed on the "hot" side (draw-thru side) of the scavenger air path in order that the OS/A is not pre-heated, even by as little as 1.5° F., prior to entering the OS/A—E/A side 354 of the air-to-air heat exchanger 350. This relative positioning also minimizes the potential for any OS/A to leak, thru any possible flow path within the IASE/RACU 310 from the OS/A—E/A side 354 of the air handler, over to the clean R/A—S/A side 352.

Operation of the scavenger air fan(s) 336 draws the E/A from an outlet side of the OS/A—E/A side 354 of the air-to-air heat exchanger 350 and forcibly ejects the E/A via outlet opening 316 and exhaust port, pipe or stack 318, which may be an integral part of the scavenger fan(s), back to the environment. The scavenger fan(s) 336 are actively controlled, thru a combination of staging (when more than one fan is employed) and speed modulation to provide only the flow rate of cooling air through the OS/A—E/A side 354 of the air-to-air heat exchanger 350 as is necessary to cool the S/A to the target supply temperature using the least total power possible. Staging or cycling fans, each having a back-draft damper device (not shown), results in energy savings when the total scavenger flow is low. This is preferable to modulating a slow speed in all of the scavenger fans 336 because the combined motor and variable speed device efficiency degrades as speed is reduced.

In exemplary embodiments, it is advantageous to specifically place the OS/A inlet opening 320 and the exhaust port, pipe or stack 318 at some distance from one another in order that expelled hot, and potentially moist, E/A does not blend with native OS/A in a manner that may affect the temperature or moisture level of the OS/A entering, i.e., by slightly pre-heating or increasing the wet bulb temperature of the OS/A prior to the OS/A being drawn through inlet opening 320 in the IASE/RACU 310.

FIG. 4 illustrates a second exemplary embodiment of an IASE/RACU 510 according to this disclosure. As shown in FIG. 4, this exemplary embodiment of the IASE/RACU 510 is based around plate-type counter flow air-to-air heat exchangers 550. The structure of this embodiment of the IASE/RACU 510 is unique in several aspects.

In this embodiment, R/A enters the IASE/RACU 510 via inlet opening 514 and is moved through the system by the power of circulating fan, or fans 538. Considerations for the operation of circulating fan(s) 538, and for the placement of circulating fan(s) 538 in the IASE/RACU 510, are the same as those discussed above with regard to inlet opening 314 and circulating fan(s) 338 in the previous embodiment depicted in FIG. 3. R/A is then moved through air-to-air heat exchangers 550 in a counter flow manner that will be described in more detail with reference to adjacent FIG. 5. In this embodiment as well, one or more active cooling coils 542 may be provided to further cool the S/A exiting the air-to-air heat exchangers 550 prior to exiting the IASE/RACU 510 via outlet opening 512.

OS/A enters the IASE/RACU through inlet opening 520. Different from the previous embodiments, however, the embodiment of the IASE/RACU 510 shown in FIG. 4 includes an additional inlet space, OS/A pre-cool and refrigeration condensing section 525. In OS/A pre-cool and refrigeration condensing section 525, a pre-filter 529 may be included. The pre-filter 529 may be followed by a direct evaporative cooler 530, installed to pre-condition the air used for heat rejection thru both the air-to-air heat exchanger 550 and a refrigeration condenser coil 540. Thus, the single direct evaporative cooler 530 may serve as a pre-cooler for both the IASE/RACU cycle and the air-cooled condenser coils. The condenser air is pulled by condenser fan, or fans 543 thru the condenser coil 540, where the heat of compression from the supplemental refrigeration process is rejected, and thru the outlet opening 516 and its respective exhaust port, pipe or stack 518 associated with condenser fan(s) 543. Condenser fan(s) 543, or their respective exhaust stacks, are implemented with backdraft dampers 519 that prevent air from bypassing pre-filter 529 and pre-cooler 530, by reversal of flow when condenser fan(s) 543 and refrigeration is off. The back-draft dampers 519 also allow for fan staging for optimal control and minimum energy consumption. The speed of fan(s) 543 may vary for control of refrigeration head pressure or to otherwise optimize the refrigeration process. The portion of the pre-cooled air leaving direct evaporative cooler 530 that flows thru the OS/A (scavenger) path of the air-to-air heat exchanger 550 to accomplish the IASE/RACU heat rejection is controlled by scavenger fan(s) 536 in the manner described above regarding the other embodiments. Each fan 536, or auxiliary exhaust stack 518 is implemented with a back-draft damper 519 such that scavenger fans 536 can be staged for optimal control as previously described in other embodiments. Back-draft dampers(s) 519 may be omitted on scavenger fan(s) 536 on systems using only one scavenger fan.

IASE/RACU 510 may include a filter 529, or an additional filter as appropriate, like filter 332 in IASE/RACU 310 shown in FIG. 3, to filter the OS/A early in the cycle in this side of the IASE/RACU 510. The specific placement of the filter 529, or an additional filter, may be selected to filter the OS/A prior to the OS/A entering the direct evaporative cooler 530 and/or the plate-type air-to-air heat exchanger 550. As with the embodiment shown if FIG. 3, the filter may work in conjunction with, or separately from the direct evaporative cooler 530, or other pre-cooling device, that may be included in the OS/A path toward the air-to-air heat exchanger 550.

A unique capability of IASE/RACU 510 is that IASE and refrigeration processes may operate completely independently of one another. Heat from R/A air flow entering through one or more R/A inlets 514 may be extracted by 100% IASE (thru the air-to-air heat exchanger 550 to the OS/A—EA cycle and be exhausted as E/A through the operation of one or more scavenger fans 536), or 100% by refrigeration coil(s) 542, where the heat of compression is rejected to condenser coil 540, or by any mix of IASE and refrigeration. The refrigeration process is controlled by either digital scroll or variable speed compressors, operating either solely, or in concert with, on/off compressors thru a vernier control method.

FIG. 5 illustrates a cross-section depicting a sample counter-flow air flow of the air in the plate-type air-to-air heat exchanger 550 depicted in the IASE/RACU 510 shown in FIG. 4. FIG. 5 details the segregation of the various air paths, and the counter-flow design of the plate-type air-to-air heat exchanger 550 components. R/A entering through inlet openings 514 that may be placed on top of, or on an upper side of, the IASE/RACU 510 passes in down through the air-to-air plate-type heat exchangers 550 and exits out the bottom of the heat exchangers 550 where it may either discharge from the unit out the bottom, or flow toward the supply outlet 512, where in so passing it may be further cooled by refrigeration coils 542 as appropriate to control the target supply temperature of the S/A. Cooling coils 542 may optionally be installed below the heat exchangers 550. This counter-flow design provides for OS/A to enter the air-to-air heat exchanger 550 through inlet openings 520 generally at a bottom, bottom side, or substantially along an entire side, of the IASE/RACU 510. The OS/A is pulled, generally by the scavenger fans 536, and condenser fans 543, at or near the exhaust outlet openings 516 and exhaust ports, pipes or stacks 518, upward and counter flow to the R/A, through the plate-type air-to-air heat exchangers 550 to exit as E/A via outlet openings 516 and exhaust ports, pipes or stacks 518 from the air-to-air heat exchangers 550 and the IASE/RACU 510, optimally including back-draft dampers 519.

Figure 6:
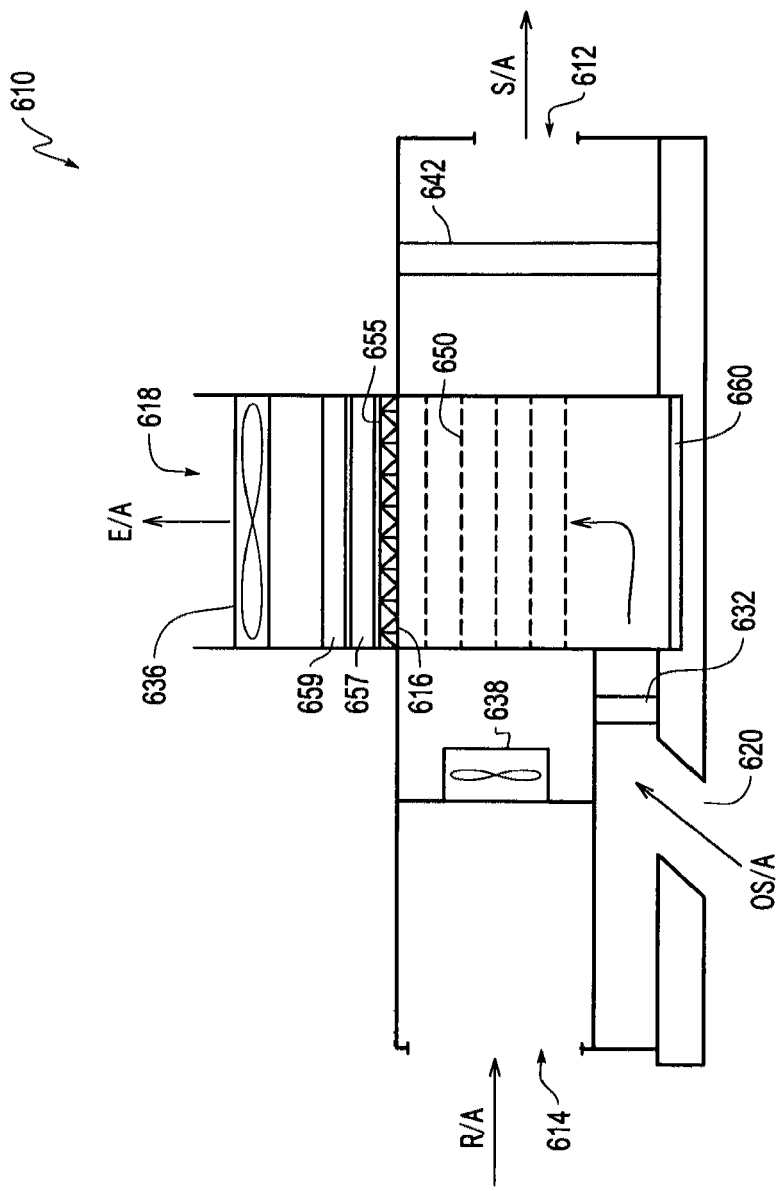
FIG. 6 illustrates a third exemplary embodiment of an IASE/RACU using polymer tubes in the air-to-air heat exchanger according to this disclosure.

FIG. 6 illustrates a third exemplary embodiment of an IASE/RACU 610 using a cross flow heat exchanger according to this disclosure. The heat exchanger 650 may be constructed of polymer tubes, polymer plates, or metallic plates, however this discussion is centered on use of the polymer-tube type heat exchanger. In this embodiment, the air-to-air heat exchanger 650 is slightly modified in the manner described below. R/A enters generally through an inlet 614 and is moved by circulating fan, or fans, 638 toward the air-to-air heat exchanger 650. In this embodiment, polymer tubes are oriented horizontally, with the R/A flowing inside the tubes through the air-to-air heat exchanger 650. OS/A enters the IASE/RACU 610 through an inlet, or inlets 620, that may optionally include a filter 632 placed at or downstream of the inlet, or inlets 620 in the airflow direction, to be drawn generally vertically through the air-to-air heat exchanger 650 and around the exterior of the polymer tubes through which the R/A is made to flow internally through the action of the circulating fan(s) 638. Movement of the OS/A is facilitated by scavenger fan, or fans 636, placed in exhaust ports, pipes or stacks 618 generally in proximity to an exhaust outlet opening 616. The scavenger fans 636 draw the E/A out of the top of the air-to-air heat exchanger 650.

An additional water spray manifold 655, and mist eliminator 657, may be provided to facilitate spraying an evaporating water film onto the exterior of the polymer tubing in the air-to-air heat exchanger 650. As was shown in other embodiments, an additional cooling coil 642 may be provided to further cool the S/A leaving the IASE/RACU 610 via outlet opening 612 to be returned to the cold aisles of the data center as shown in FIG. 1. In addition, if mechanical cooling is used then it is advantageous from a refrigeration efficiency standpoint to use the often cooler, moist scavenger air leaving the heat exchanger to reject heat from the condenser coil 659 as shown in FIG. 6.

In the horizontal polymer-tube IASE/RACU 610 of this embodiment, an elliptical shape of heat exchanger tubes may maximize the allowable surface area for heat rejection. Polymer tubing is used that is sufficiently elastic such that subtle expansion and contraction resulting from pressure increases and decreases within the tubes according to normal operation of the IASE/RACU 610 will aid in shedding residual solids from the polymer tubes that may form as a by-product of evaporation. With OS/A flowing over an exterior wet tube surface, evaporative heat transfer results in additionally efficient cooling of the air in the R/A—S/A side of the heat exchanger in order that the R/A from the hot aisles of the data center, as shown in FIG. 1, flowing through the inside of the polymer tubes, is efficiently cooled.

It should be recognized that such an air-to-air heat exchanger 650 could be operated dry, but there is a specific increase in efficiency when the outside of the polymer tubes are wetted. Additionally, when comparing wet polymer-type heat exchangers to dry plate-type counter flow heat exchangers, advantages are further recognized that include (1) generally lower equipment costs, (2) reduced size and weight, (3) additional energy efficiency based, for example, on lower scavenger-side pressure drop and corresponding required scavenger fan power, (4) a reduction in the requirement to filter OS/A since water sprays continuously are washing the scavenger side of the heat exchanger during operation with sprays on, and (5) polymers used in the construction of the tubing are corrosion resistant. Against these advantages, certain disadvantages need to be evaluated for a specific application. These disadvantages are based around greater consumption of water and the potential necessity for non-chemical, or chemical based, water treatment systems. When the outdoor air dry-bulb temperature is below approximately 35° F., the water sump(s) 660 may be drained and the system may be operated dry to avoid freezing. The OS/A may be filtered prior to the heat exchanger 650, by filters 632, thereby helping to keep the sump and circulating water system cleaner.

Figure 7:
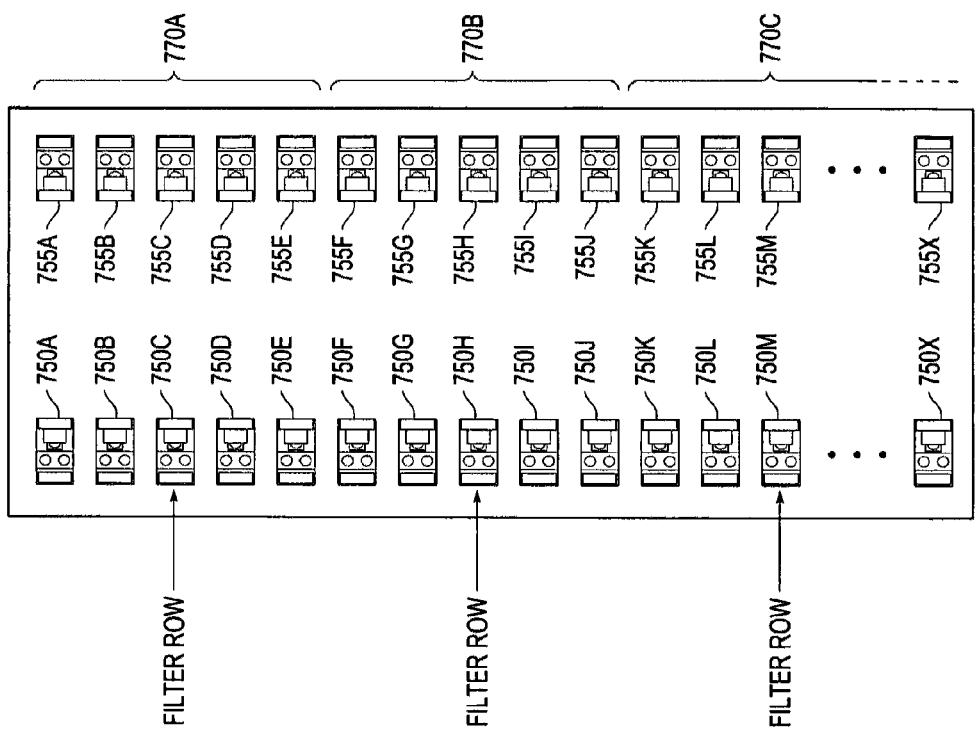
FIG. 7 illustrates an exemplary roof-top distribution of a plurality of IASEs/RACUs according to this disclosure.

FIG. 7 illustrates an exemplary roof-top distribution of a plurality of IASEs/RACUs 750, 755 according to this disclosure. As shown in FIG. 7, a plurality of appropriately-sized IASEs/RACUs 750, 755 may be placed on, for example, a rooftop of the data center to provide the required air flow to facilitate the disclosed cooling process.

As mentioned briefly above, substantial benefit of the systems and methods according to this disclosure is the elimination of detailed filtering methodologies which are required for other air conditioning system installations that may support a data center. In this regard, filters may be limitedly provided as appropriate in the SSFU discussed above, or otherwise in less than all of the plurality of IASEs/RACUs 750, 755. In a typical installation, for example, one in five IASEs/RACUs 750, 755 may include an additional filtering capability. As shown in FIG. 7, the plurality of IASEs/RACUs 750, 755 may be divided into a plurality of zones 770 for a particular data center with air cleaning/particulate removal being accomplished by filters installed in the middle row of each zone of IASEs/RACUs 750, 755, i.e., IASEs/RACUs 750C, 755C for zone 770A, IASEs/RACUs 750H, 755H for zone 770B, IASEs/RACUs 750M, 755M for zone 770C, and so on. The combination of the filters in the SSFU, and/or in a portion of the IASEs/RACUs 750, 755, is optimized to afford appropriate filtration while maintaining the efficiency of the overall air handling system by not adversely impeding air flow through the system with additional unwarranted filtration.

It should be recognized that the systems and methods according to this disclosure are not limited to, for example, any particular installation such as that shown as a rooftop embodiment for IASEs/RACUs 750A-X, 755 A-X in FIG. 7. The IASEs/RACUs 750, 755 could be, for example, mounted on pads on the ground adjacent to, or otherwise mounted in any manner to the exterior or interior of, the building to facilitate, depending on construction of the building, their ability to intake OS/A and exhaust E/A away from the OS/A inlets while providing cooling of the R/A through an air-to-air heat exchanger to provide S/A at the target air delivery temperature, to the cold aisles of the data center shown in FIG. 1.

C. Side-Stream Filtration Unit (SSFU)

Figure 8:
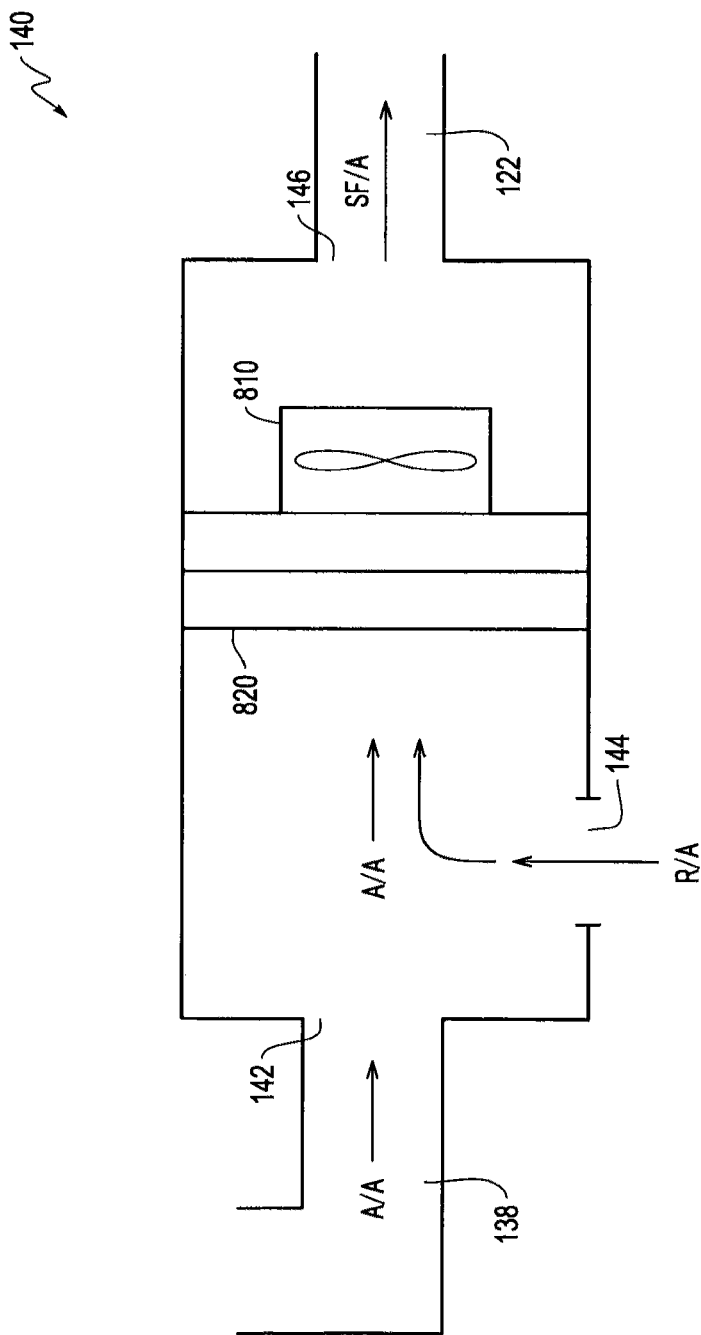
FIG. 8 illustrates a schematic diagram of an exemplary embodiment of a Side Stream Filtration Unit (SSFU) according to this disclosure.

FIG. 8 illustrates a schematic diagram of an exemplary embodiment of a Side Stream Filtration Unit (SSFU) 140 according to this disclosure. As shown in FIG. 8, an SSFU 140 may include an A/A inlet opening 142 via which, for example, a conduit 138 from a MUAD/HU 130 as shown in FIG. 1 may provide A/A. R/A is drawn into the SSFU 140 via inlet opening 144. As indicated above, an objective may be for filtration/particulate removal of R/A from the space at a volumetric exchange rate of, for example, 6-10 air exchanges per hour, augmented by optional polishing filtration of A/A in the SSFU. Air flow through the SSFU 140 may be controlled by a variable speed circulating fan 810 that draws the optional A/A and R/A, admitted as indicated, through the SSFU 140, including through one or more air filters 820. The air filters 820 of the SSFU 140 may be of any composition that best facilitates filtering the air, including pleated filters, final filters up to HEPA grade, gas phase filtration units, electrostatic filtration units, and the like. The use of an SSFU 140 in the manner described allows particulate and gaseous substances to be removed from data center R/A, while avoiding the necessity to volumetrically filter all of the air passing into and out of the IASEs/RACUs 110, as shown in FIG. 1 Removing the need to filter all of the air saves, for example, significant circulating fan motor horsepower. A filtered combination of optional A/A and R/A, after passing through air filters 820 under the control of variable speed circulating fan 810, may exit the SSFU 140 via outlet 146 as SF/A to be re-merged, e.g., via a conduit 122 with the larger volume of R/A flowing to the plurality of IASEs/RACUs 100 via the R/A plenums 156 (as shown in FIG. 1), or simply back into the room.

D. Make-Up Air Dehumidification/Humidification Units (MUAD/HU)

Figure 9:
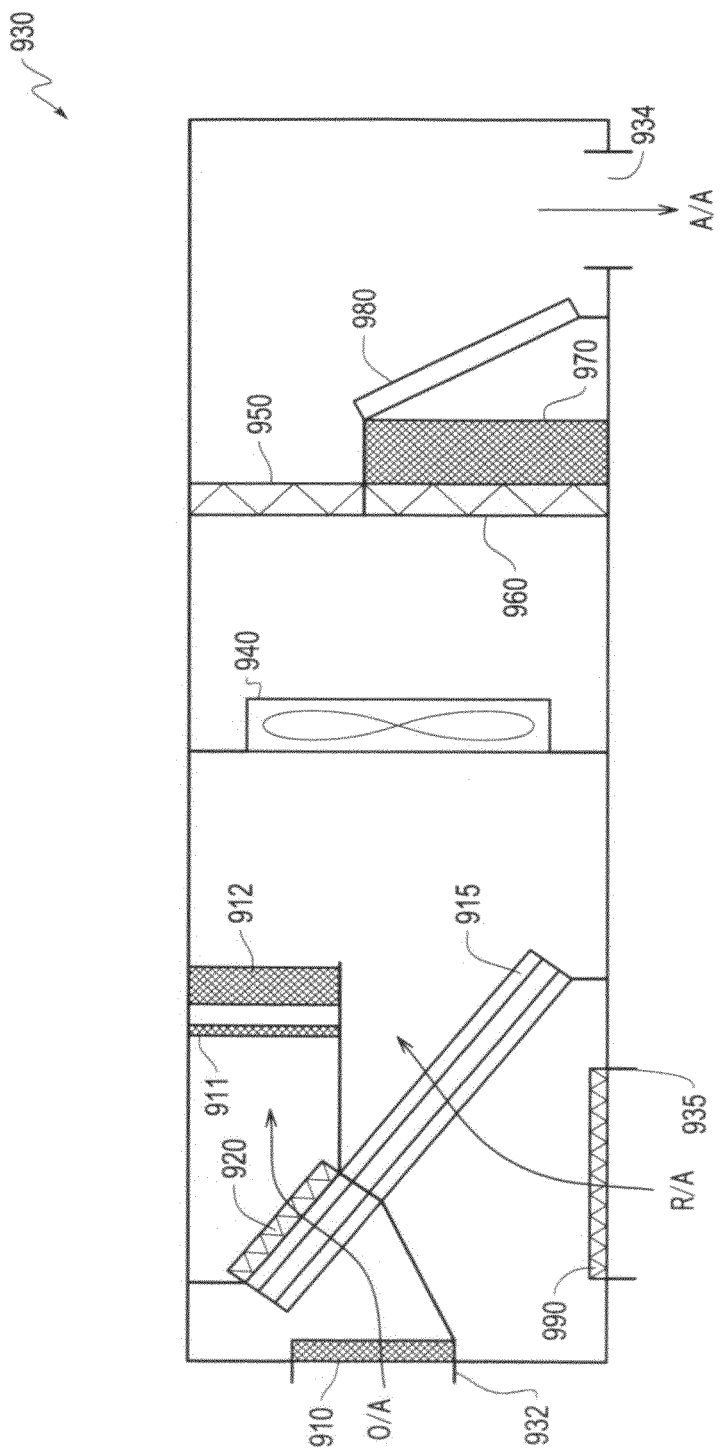
FIG. 9 illustrates a schematic diagram of a first exemplary embodiment of a Make-Up Air Humidification Unit (MUA/HU) according to this disclosure.

FIG. 9 illustrates an exemplary embodiment of a Make-Up Air Humidification Unit (MUA/HU) 930 according to this disclosure, as an example of the MUAD/HU 130 shown in FIG. 1. As shown in FIG. 9, an exemplary embodiment of an MUA/HU 930 may include an OS/A inlet opening 932, that may include an intake hood (not shown), through which OS/A is drawn into the MUA/HU 930. A roughing, e.g. metal mesh, pre-filter 910 may be employed over the inlet opening 932 of the MUA/HU 930. R/A may be drawn into the MUA/HU 930 via inlet opening 935, via R/A damper 990 to control the flow of R/A into the MUA/HU 930 based on climatological conditions to facilitate other (heating/humidifying) operations of the MUA/HU 930. A heat pipe 915 may be provided to facilitate pre-heating the OS/A (temperature equalizing of the OS/A and R/A prior to mixing) when the OS/A damper 920 associated with the heat pipe 915 is open to admit the OS/A through the MUA/HU 930. Air flow through the MUA/HU 930 is facilitated by fan 940. The OS/A may be filtered by one or more filters, for example, including a pre-filter 911 followed by a final filter 912. With evaporative humidifier pad face and bypass dampers, 960 and 950 respectively, air flow humidification can be controlled through a humidifier 970. A mist eliminator 980 may be installed after the evaporative humidifier pad of the humidifier 970 to attempt to ensure there is no carry-over of water droplets into the A/A airstream exiting the MUA/HU 930 via outlet opening 934. When more humidification is required, the face damper 960 is modulated more open while the bypass damper 950 is modulated more closed. Alternatively, when less humidification is required the face damper 960 is modulated more closed while the bypass damper 950 is modulated more open. In this manner, the A/A output from the MUA/HU 130 via outlet opening 934 may be appropriately humidified.

The exemplary embodiment of a MUA/HU 930 shown in FIG. 9 is unique in a number of advantageous aspects. First, the exemplary MUA/HU 930 affords an ability to precisely control humidification with no external heat source. All of the heat for the humidification process is derived from the R/A of the data center itself. Second, removal of the intake roughing filters 910 during winter operation, allows the design to provide for OS/A entry without restriction even during extreme snow, icing, hoar frost, and other winter extremes. The heat pipe 915 transfers heat from the data center R/A to pre-heat the OS/A well above freezing. This pre-heating of the OS/A allows for the mixing of OS/A and R/A airstreams without, for example, risk of forming ice crystals prior to humidification and attempts to ensure that the mixed air wet-bulb is well above freezing prior to the adiabatic humidification process. Third, the heat pipe 915 may have an offset partition so as to allow for greater R/A air flow relative to OS/A air flow, without imposing excess pressure drop. In extreme cold climates, the R/A air flow may be maintained advantageously up to three times the air flow of the OS/A to achieve a desired OS/A pre-heating and hundidification. Fourth, the heat pipe 915 may be installed sloped, as shown in FIG. 9, completely vertical with the warm return flowing over the lower tube fins, or horizontal as optimal for any design constraints and climatological conditions. Fifth, filtration of only the OS/A fraction by one or more filters such as those depicted as elements 910, 911 and 912 in FIG. 9, allows for the use of smaller filters resulting in lower cost and allows the R/A over the heat pipe 915 to incur commensurate pressure drop to the combined total pressure drop of the OS/A path without impacting the fan motor power. Finally, OS/A flow may be kept constant as filters load by implementing an air flow measurement device in the OS/A path, which may be accomplished by correlation of the OS/A air flow rate with pressure drop over the heat pipe 915, and modulating the OS/A damper 920 and/or speed of the fan 940 to maintain the appropriate air flow value. Alternatively, the OS/A damper 920 may modulate for control of building pressure.

It should be noted further that the use of a parallel flow heat pipe to gain process advantage in the means detailed is an additional unique feature of the exemplary MUA/HA 930 shown in FIG. 9.

Figure 10:
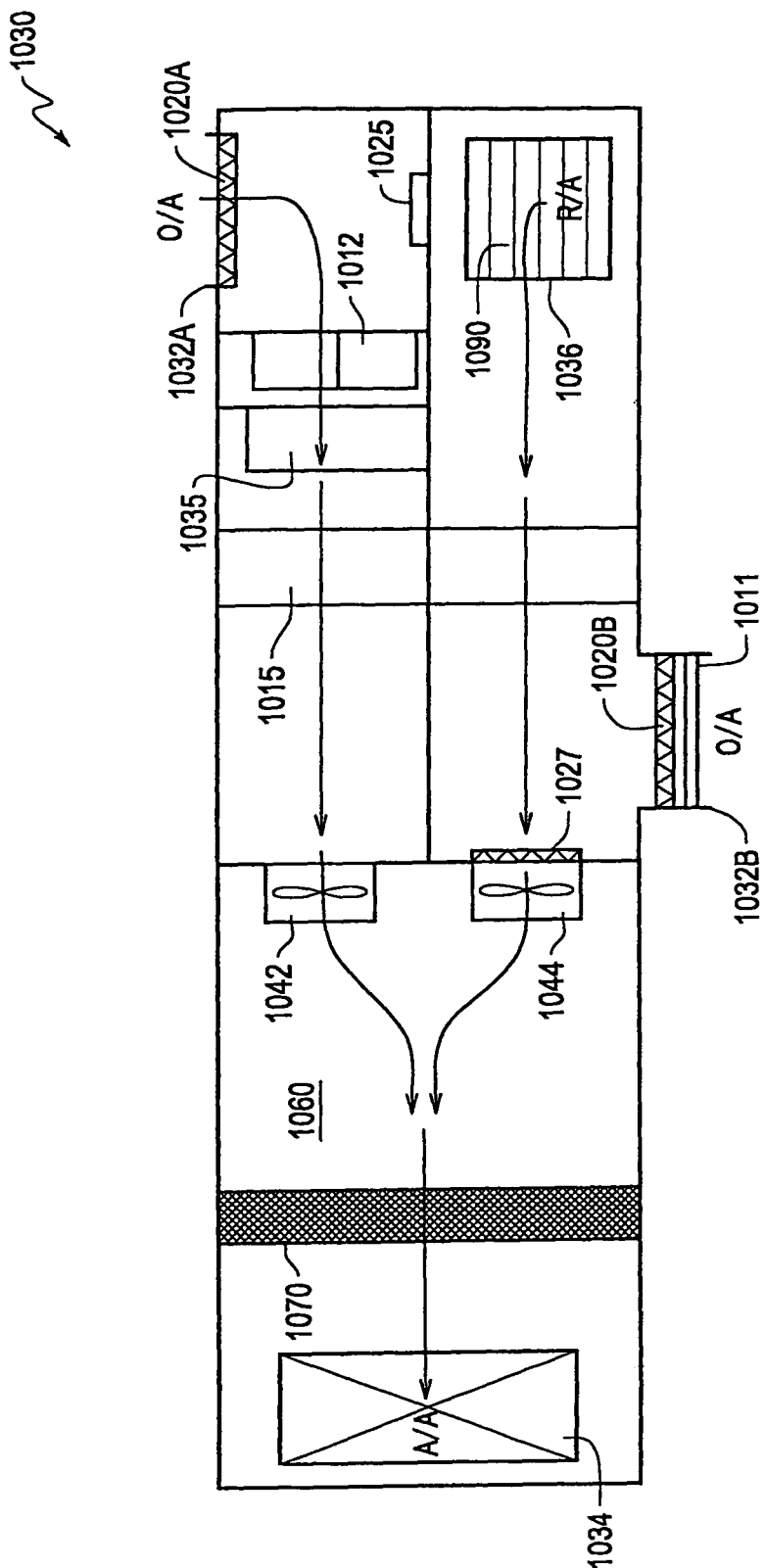
FIG. 10 illustrates a plan view schematic diagram of a second exemplary embodiment of a Make-Up Air Dehumidification/Humidification Unit (MUAD/HU) in a first operating mode according to this disclosure.
Figure 11:
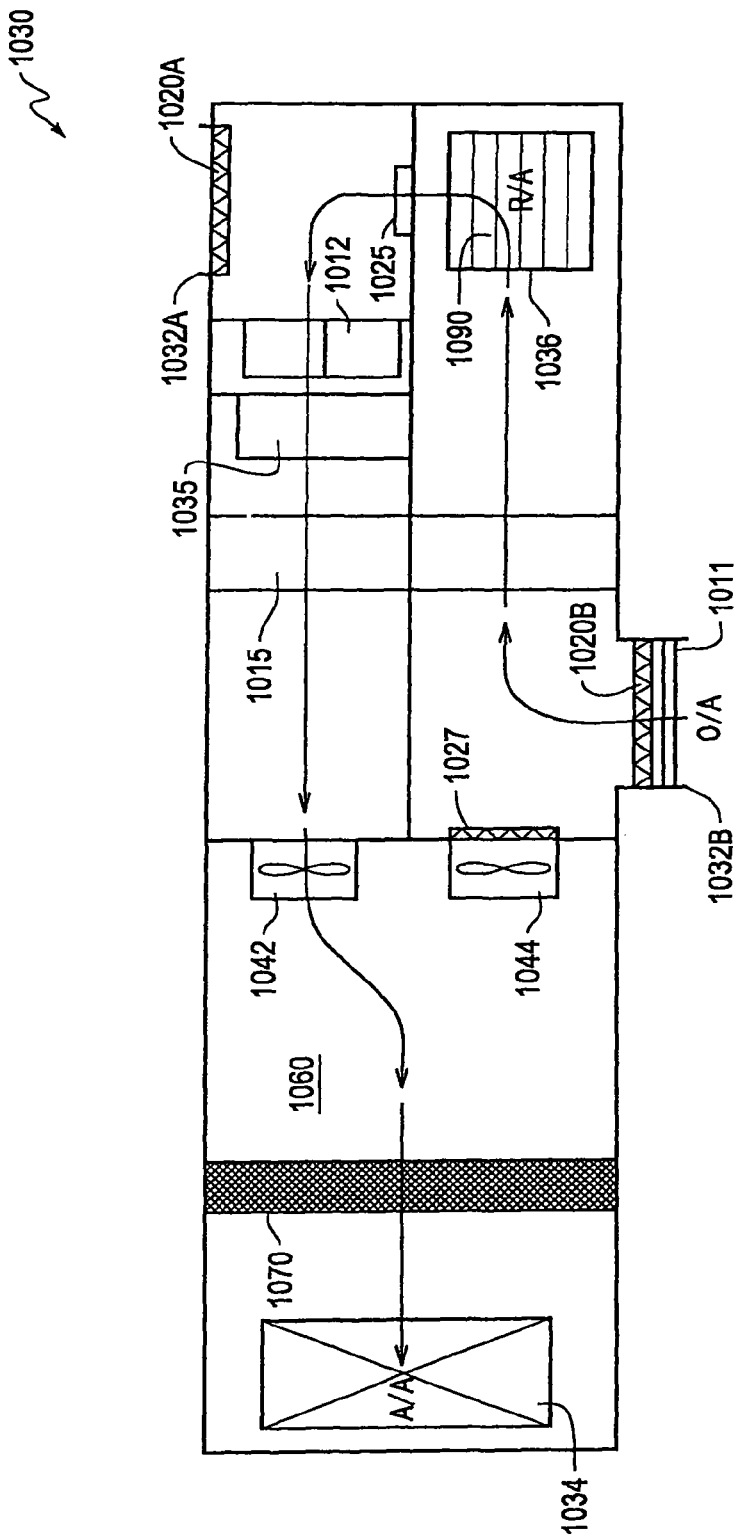
FIG. 11 illustrates a plan view schematic diagram of the second exemplary embodiment of the MUAD/HU shown in FIG. 10 in a second operating mode according to this disclosure.
Figure 12:
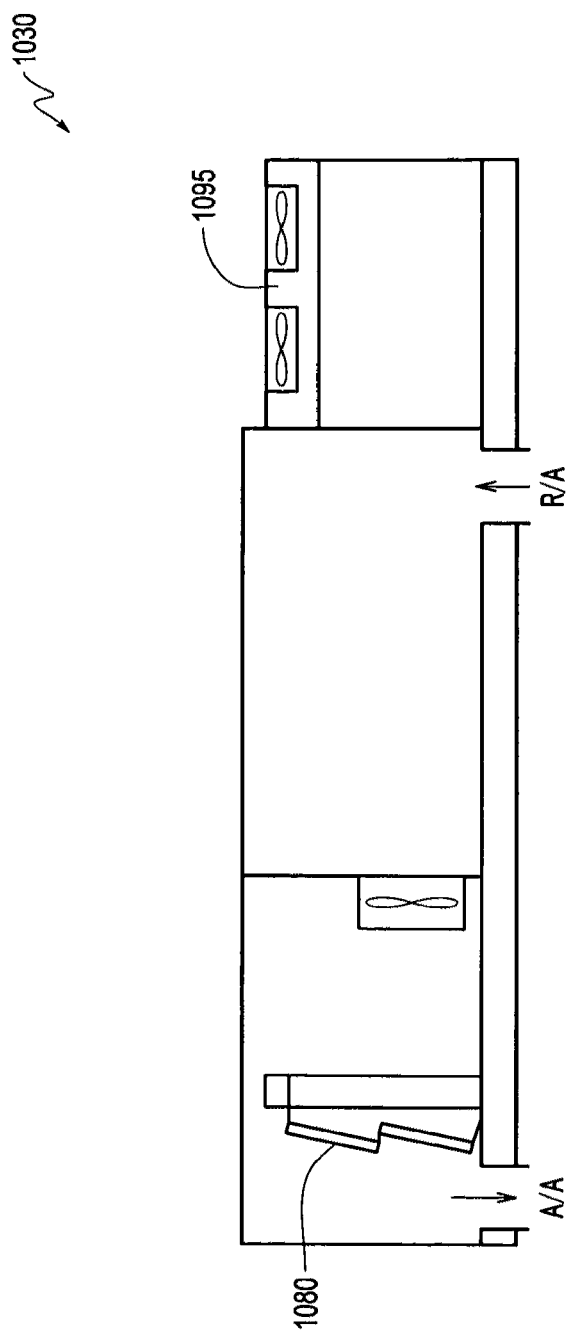
FIG. 12 illustrates an elevation view schematic diagram of the second exemplary embodiment of the MUAD/HU shown in FIG. 10 according to this disclosure.

FIGS. 10-12 (in multiple plan views and a single elevation view) illustrate a second exemplary embodiment of a Make-Up Air Dehumidification/Humidification Unit (MUAD/HU) 1030 according to this disclosure. As shown in plan views in FIGS. 10 and 11, an exemplary embodiment of a MUAD/HU 1030 includes a winter (humidification) OS/A inlet opening 1032A and a summer (dehumidification) OS/A inlet opening 1032B, each of which may include an intake hood, by which OS/A is drawn into the MUAD/HU 1030 during the respective humidification or dehumidification mode of operation according to climatological conditions and seasons. An OS/A pre-filter 1011 may be employed at the summer OS/A inlet opening 1032B of the MUAD/HU 1030. R/A may be drawn into the MUAD/HU 1030 via inlet opening 1036, via R/A damper 1090 to control the flow of R/A into the MUAD/HU 1030 based on climatological conditions to facilitate other (heating/humidifying) operations of the MUAD/HU 1030. A heat pipe 1015 may be provided to facilitate pre-heating the OS/A (temperature equalizing of the OS/A and R/A prior to mixing) when a winter OS/A damper 1020A is open to admit the OS/A through the MUAD/HU 1030 during a humidification mode operation. Air flow through the MUAD/HU 1030 is facilitated by ventilation fan 1042 and recirculation fan 1044. MUAD/HU 1030 may include a humidifier 1070 and a dehumidification coil 1035. MUAD/HU 1030 may also include on-board refrigeration 1095 (air or water cooled, see FIG. 12) to facilitate the dehumidification process. Ventilation fan 1042 may include an air flow measuring device and controls to maintain constant flow of air under all operating modes. Ventilation air fan 1042 and recirculation air fan 1044 motors may include variable speed control devices.

Details of a Winter (Humidification Mode) for the exemplary embodiment of the MUAD/HU 1030 depicted in FIGS. 10-12 will now be described with specific reference to FIG. 10.

During winter (humidification mode) operation, OS/A air enters the MUAD/HU 1030 via OS/A inlet opening 1032A through winter OS/A damper 1020A. The OS/A flows through final filter 1012, inactive dehumidifying coil 1035, and heat pipe 1015 (where the OS/A receives preheat energy from R/A), pulled by ventilation fan 1042 into mixing chamber 1060. Summer transfer damper 1025 is closed during humidification mode operation. Ventilation fan 1042 may speed up, or slow down, as required to maintain constant ventilation air flow or room pressure. R/A damper 1090 opens, allowing R/A to flow through heat pipe 1015 and impart heat to the cooler OS/A flowing over the opposite side of the heat pipe 1015. R/A is pulled by recirculation air fan 1044, through recirculation air isolation damper 1027 (which may be a motorized or back-draft type) into mixing chamber 1060, where the R/A blends with the OS/A. The mixture of OS/A and R/A flows through humidifier 1070, where moisture is added into now mixed A/A prior to exiting the MUAD/HU 1030 via outlet 1034. Humidification is controlled by varying the speed of recirculation air fan 1044. On a call for more humidification, recirculation fan 1044 speeds up for greater flow of warmed R/A. On a call for less humidification recirculation fan 1044 slows down. A mist eliminator 1080 (see FIG. 12) may be installed after the evaporative humidifier pad of the humidifier 1070 to attempt to ensure there is no carry-over of water droplets into the A/A airstream exiting the MUAD/HU 1030. In this manner, the A/A output from the MUAD/HU 1030 via outlet opening 1034 may be appropriately humidified.

Details of a Summer (Dehumidification Mode) for the exemplary embodiment of the MUAD/HU 1030 depicted in FIGS. 10-12 will now be described with specific reference to FIG. 11.

During summer (dehumidification mode) operation, OS/A enters the MUAD/HU 1030 via OS/A inlet opening 1032B through summer OS/A damper 1020B. The OS/A flows through pre-filter 1011 prior to entry into the MUAD/HU 1030. The OS/A flows through pre-cool path of optional heat pipe 1015, through the summer transfer damper 1025, through final filter 1012, into active dehumidifying coil 1035, where moisture is extracted as controlled by modulation of a chilled water valve or staging/modulating compressors when on-board refrigeration is employed, and finally through the reheat path of optional heat pipe 1015 (where it receives reheat energy from warmer OS/A and imparts beneficial pre-cooling to the OS/A). This pre-cool air reheat cycle, as defined by ASHRAE, is well defined in the HVAC industry and is sometimes referred to as a "Wringer" cycle. During dehumidification mode, recirculation damper 1090 is closed, recirculation isolation damper 1027 is closed, and recirculation fan 1044 is off. Ventilation air is pulled by ventilation fan 1042, where it passes through inactive humidifier 1070 to A/A outlet 1034. In this manner, the A/A output from the MUAD/HU 1030 via outlet opening 1034 may be appropriately dehumidified as required for control of room dew point or relative humidity. The pre-cool air reheat cycle may save typically 25% to 50% of the cooling/dehumidification energy that would otherwise be required.

The exemplary embodiment of a MUA/HU 1030 shown in FIGS. 10-12 is unique in a number of advantageous aspects. First, MUAD/HU 1030 affords the ability to precisely control humidification, by variable recirculation flow controlled by recirculation fan 1044 with no external heat source (all heat for the humidification process is derived from the data center itself from the warm R/A airstream). Second, the heat pipe 1015 transfers heat from the data center R/A to pre-heat the OS/A well above freezing. This pre-heating of the OS/A allows for the mixing of OS/A and R/A airstreams without risk of forming ice crystals prior to humidification and ensures that the mixed air wet-bulb is well above freezing prior to the adiabatic humidification process. Third, the heat pipe 1015 may have an offset partition to allow for greater R/A air flows relative to OS/A air flows, without imposing excess pressure drop. In extreme cold climates, the R/A air flow may be maintained advantageously up to three times the air flow of the OS/A to achieve a desired humidification. Fourth, the heat pipe 1015 may be installed sloped, with the lowest point in the recirculation/pre-cool path of the heat pipe 1015 or horizontal as optimal for any design. Fifth, filtration of only the OS/A fraction allows for smaller filters resulting in lower cost. Sixth, OS/A flow may be kept constant as filters load by implementing an air flow measurement device on the OS/A fan (for example a piezometer ring installed at the fan 1042 inlet with a pressure transmitter). Finally, the heat pipe 1015 is used to benefit in both dehumidification and humidification modes in a unique way.

E. Method for Controlling High Internal Heat Gain Recirculated Air Cooling System It should be appreciated that the various components shown in FIG. 1, for example, allow for precise control of the heat dissipation, particulate removal, air quality, and humidity levels within the data center. The precise control is based on individual control methodologies for the independent components, and specifically on control of the flow rates of air through both sides of the IASEs/RACUs for the heat rejection process. The individual control methodologies can be synchronized among any combination of the components based on measured conditions internal and external to the data center. Inputs and feedback may be provided by sensors located within the data center, within the individual components, or within the external environment.

Computer controlled optimization may be undertaken according to a number of methodologies for most efficiently managing the cooling through the plurality of IASEs/RACUs supporting a specific data center. For a specific horizontal elliptical profile polymer-tube type air-to-air heat exchanger, as shown in FIG. 6, mathematical modeling has led to the derivation of Equation 1 that approximates the Wet Bulb Depression Effectiveness (WBDE) and may potentially be used to advantage for controlling the IASE/RACU.

$$\text{WBDE} \approx (-0.0009 t^2 + 0.0758 t + 16.158) \ln(m_w/m_d + 0.29 t - 0.3 (t - t^*) + 52 \quad \text{(Equation 1)}$$

where:
  t is OS/A dry-bulb temperature in degrees Fahrenheit;
  t* is OS/A wet-bulb temperature in degrees Fahrenheit;
  $m_w$ is mass flow rate of OS/A entering the air-to-air heat exchanger in pounds dry air per hour;
  $m_d$ is mass flow rate of hot aisle R/A entering the heat exchanger measured in pounds dry air per hour; and
  WBDE is resolved as a percentage.

Equation 1 is essential for energy modeling because it allows for computation of mass flow of OS/A required to cool the R/A to a target delivery temperature given any OS/A dry-bulb and wet-bulb conditions. As an example, given a R/A temperature (after an addition of approximately 1.5° F. heat added by operation of the recirculating fan yielding 101.5° F. R/A at, for example, 55° F. dew-point, and ambient OS/A conditions of 58° F. dry-bulb temperature and 51° F. wet-bulb temperature, the first step is to compute the WBDE necessary to achieve a target supply condition (assume 75° F.) according to Equation 2 below.

$$t_s = t_r - \text{WBDE}(t_r - t_{wb}) \quad \text{(Equation 2)}$$

where:
  $t_s$ is the temperature of the target S/A (in this example, 75° F.);
  $t_r$ is the temperature of the R/A (in this example, 101.5° F.);
  $t_{wb}$ is the local outside wet-bulb temperature (in this example, 51° F.);

Substituting the above values, the computed WBDE in this example is 0.525. This represents the air-to-air heat exchanger WBDE that is required to cool the R/A to the target S/A condition. Substituting this computed WBDE into Equation 1, it is a simple matter to compute the required mass flow ratio of OS/A to R/A. In the example given, solving Equation 1 would result in a determination that OS/A mass flow rate is required to be 44% of R/A mass flow rate.

While equations 1 and 2 are required for energy modeling, the IASEs/RACUs control discharge air temperature by varying the speed of, and/or staging scavenger fans in concert with controlling supplemental cooling coils as previously described It should be recognized, based on the above equations, that as WBDE declines and required OS/A flow is reduced, the scavenger fans in the OS/A E/A side of the IASE/RACU can operate at a lower capacity while maintaining the required temperature of the S/A to the data center.

As indicated above, S/A temperature is principally controlled by varying OS/A scavenger air flow. Such control can be executed in a number ways. When, for example, ambient wet-bulb temperature is high, scavenger fans in the OS/A—E/A side of the IASE/RACU may run at 100% of design, to achieve maximum heat rejection. In such conditions, additional cooling from, for example, direct expansion refrigeration cooling, as are described in certain of the embodiments of the IASE/RACU systems above, may be required. An advantage in a polymer-tube air-to-air heat exchanger-based IASE/RACU system, as shown, for example, in FIG. 6 is that the scavenger fans in the OS/A E/A side of the IASE/RACU can be sized up to 50% more than rated flow. A consequent advantage of this sizing is that less incremental power may be required relative to refrigeration-based cooling to achieve equivalent heat rejection.

Scavenger fan motors that pull the OS/A through the air-to-air heat exchanger in the IASE/RACU are, therefore, generally equipped with variable speed controls. These variable speed controls permit operation that controls flow rate of OS/A as appropriate in order that S/A flow from the IASEs/RACUs can be carefully matched to the requirements for temperature control in the data servers of the data center. Supply fan motors also are generally equipped with variable speed controls, and supply fan flow is regulated generally to match the flow of air pulled by the server fans by various control algorithms.

The algorithms required for control of the supply air temperature and flow are readily programmed into modern direct digital controllers or PLCs.

Figure 13:
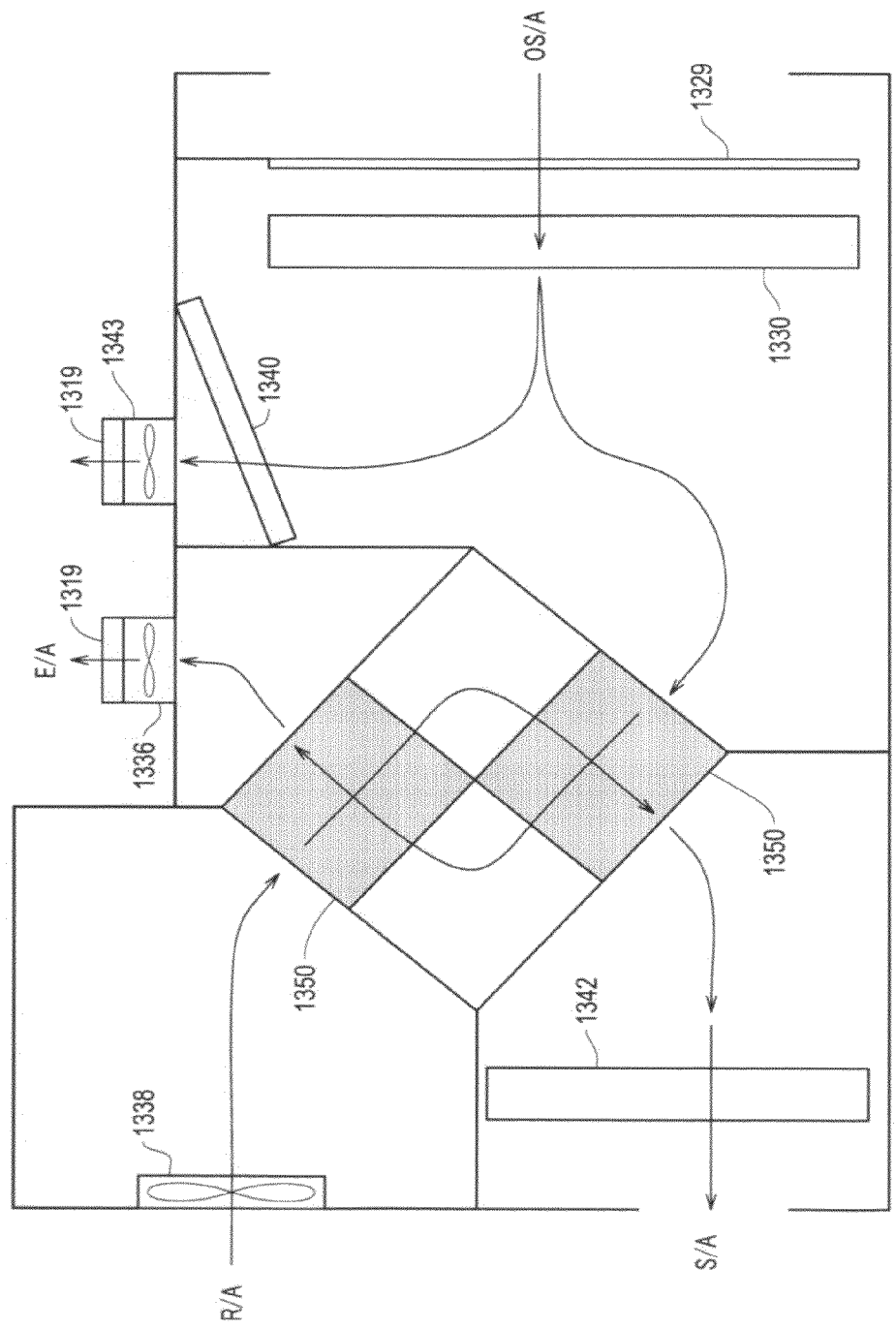
FIG. 13 illustrates a schematic diagram of a third exemplary embodiment of an IASE/RACU design including a vertical dual cross-flow plate-type heat exchanger arrangement according to this disclosure.
Figure 14:
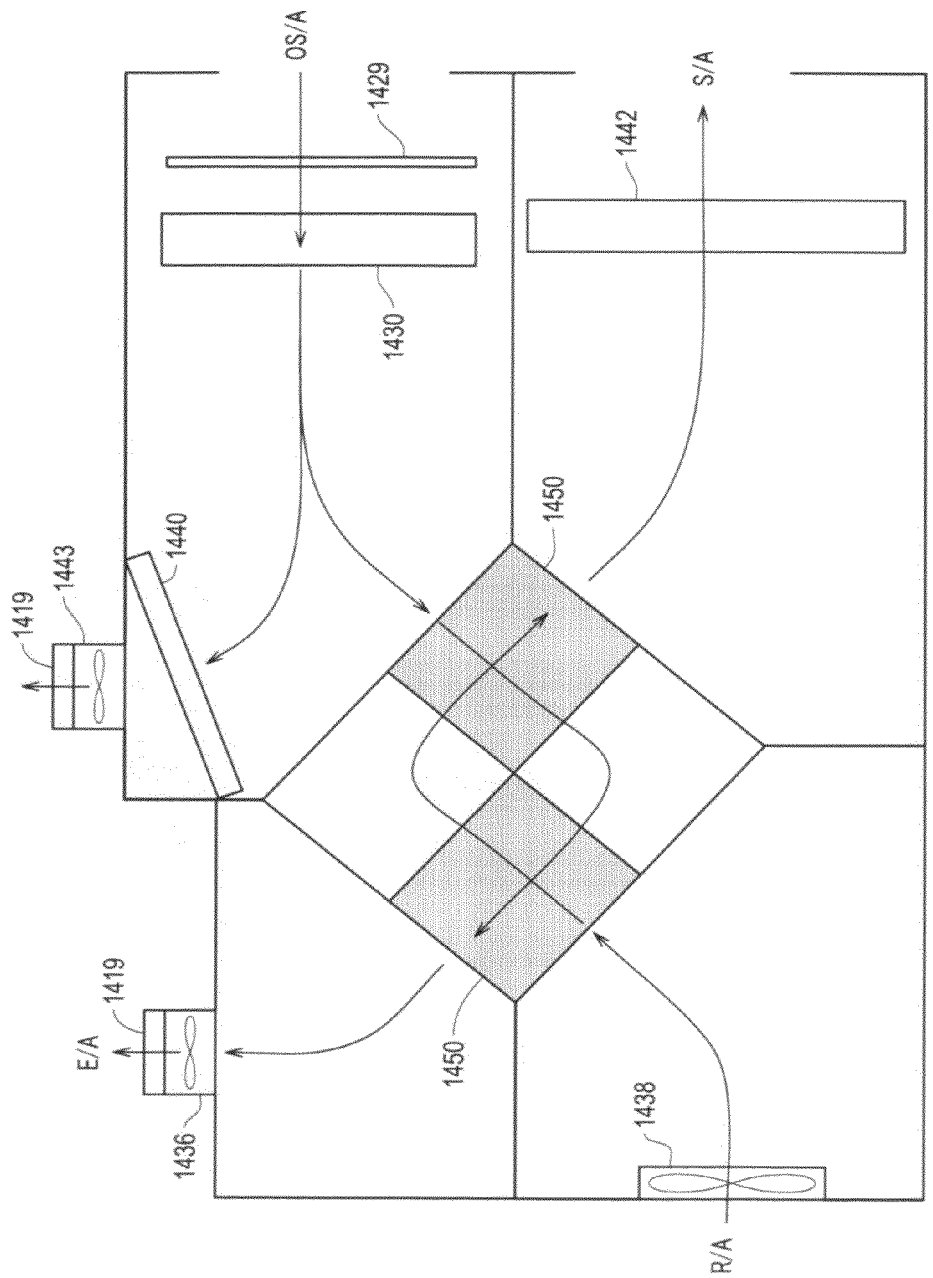
FIG. 14 illustrates a schematic diagram of a fourth exemplary embodiment of an IASE/RACU design including a horizontal dual cross-flow plate-type heat exchanger arrangement according to this disclosure.
Figure 15:
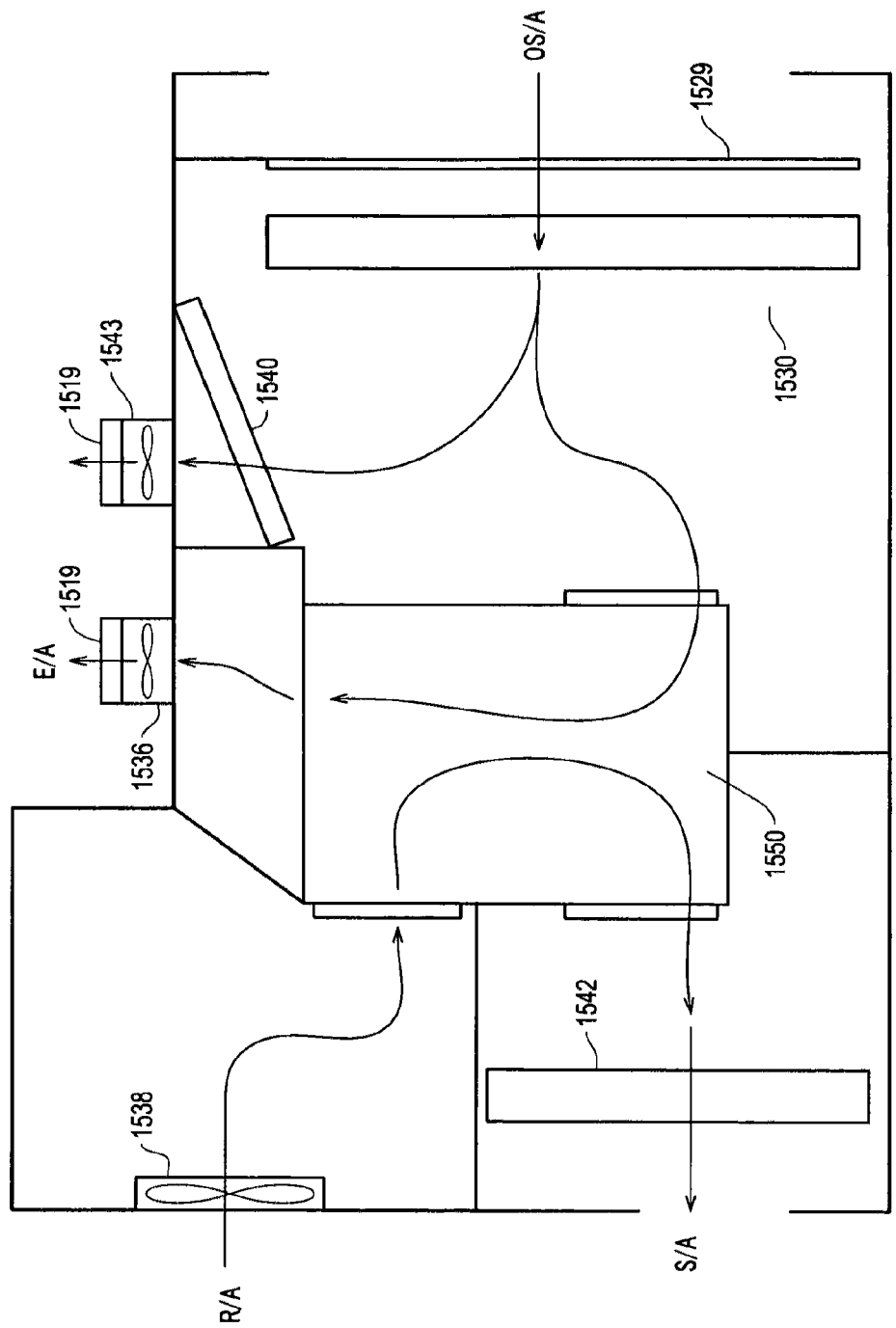
FIG. 15 illustrates a schematic diagram of a fifth exemplary embodiment of an IASE/RACU design including a vertical counter flow plate-type heat exchanger arrangement according to this disclosure.
Figure 16:
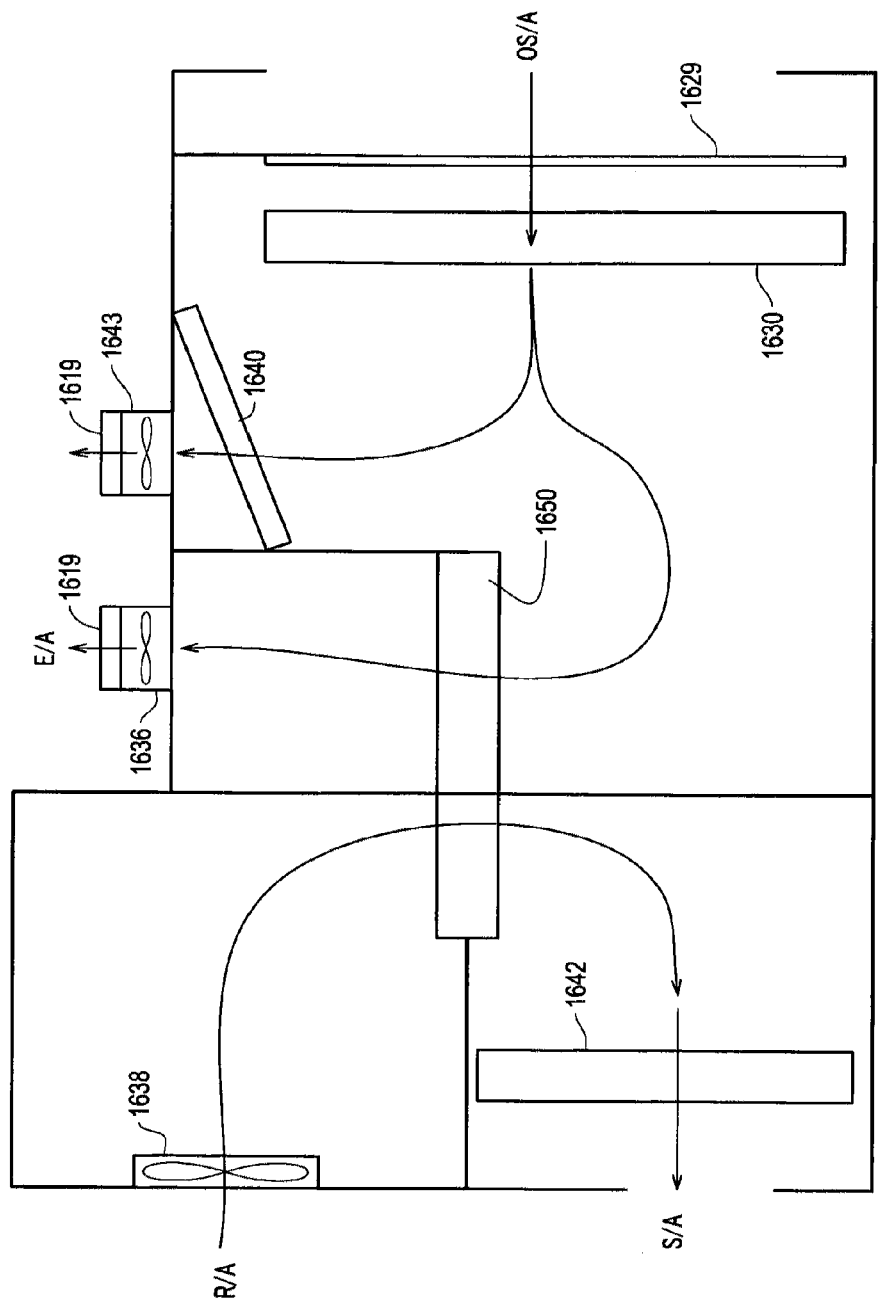
FIG. 16 illustrates a schematic diagram of a sixth exemplary embodiment of an IASE/RACU design including a horizontal heat pipe heat exchanger arrangement according to this disclosure.
Figure 17:
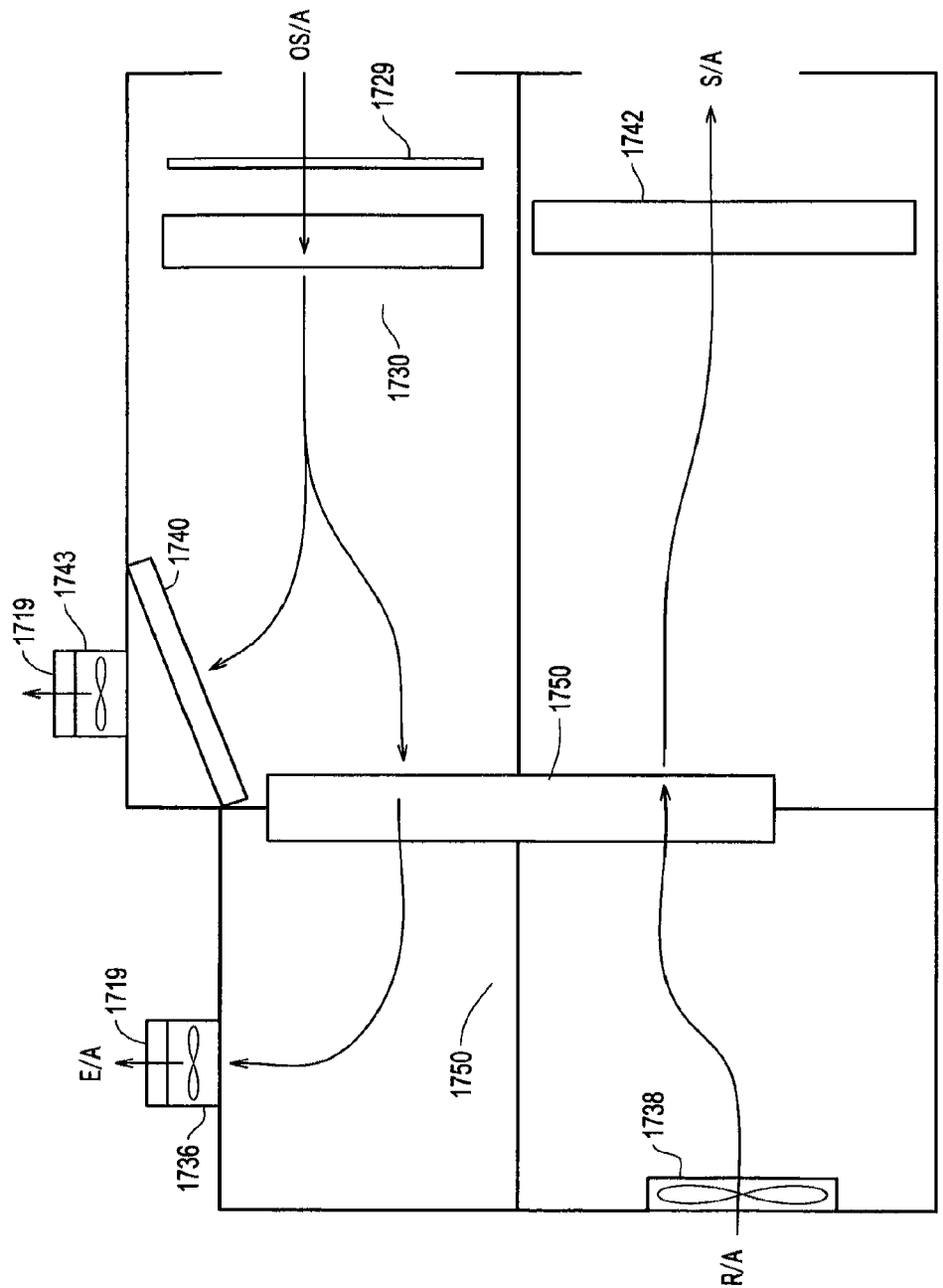
FIG. 17 illustrates a schematic diagram of a seventh exemplary embodiment of an IASE/RACU design including a vertical heat pipe heat exchanger arrangement according to this disclosure.

While this disclosure describes a number of specific embodiments, it is evident that many alternatives, modifications and variations will be apparent to those skilled in the art. Accordingly, the exemplary embodiments set forth in this disclosure are intended to be illustrative, not limiting. For example, various other IASE/RACU designs schematically equivalent to the arrangement detailed in FIGS. 4 and 5 are illustrated FIGS. 13-17, based on an assortment of other plate-type heat exchanger and heat pipe options. In particular, FIGS. 13-17 illustrate schematic diagrams of third through seventh exemplary embodiments of IASE/RACU designs including the assortment of heat exchangers. FIG. 13 illustrates a schematic diagram of a third exemplary embodiment of an IASE/RACU design including a vertical dual cross-flow plate-type heat exchanger arrangement. FIG. 14 illustrates a schematic diagram of a fourth exemplary embodiment of an IASE/RACU design including a horizontal dual cross-flow plate-type heat exchanger arrangement. FIG. 15 illustrates a schematic diagram of a fifth exemplary embodiment of an IASE/RACU design including a vertical counter flow plate-type heat exchanger arrangement. FIG. 16 illustrates a schematic diagram of a sixth exemplary embodiment of an IASE/RACU design including a horizontal heat pipe heat exchanger arrangement. FIG. 17 illustrates a schematic diagram of a seventh exemplary embodiment of an IASE/RACU design including a vertical heat pipe heat exchanger arrangement. In each of the depicted arrangements of FIGS. 13-17, based on the assortment of other plate-type heat exchanger and heat pipe options, like features are addressed with similar nomenclature. In FIGS. 13-17, RIA circulating fans are respectively referred to as elements 1338, 1438, 1538, 1638 and 1738. Scavenger fans are respectively referred to as elements 1336, 1436, 1536, 1636 and 1736. Condenser fans are respectively referred to as elements 1343, 1443, 1543, 1643 and 1743. Back draft dampers associated with both scavenger fans and condenser fans are respectively referred to as elements 1319, 1419, 1519, 1619 and 1719. Refrigeration coils are respectively referred to as elements 1342, 1442, 1542, 1642 and 1742. Directive evaporative coolers are respectively referred to as elements 1330, 1430, 1530, 1630 and 1730. OS/A filters are respectively referred to as elements 1329, 1429, 1529, 1629 and 1729. Condenser coils are respectively referred to as elements 1340, 1440, 1540, 1640 and 1740. The individually depicted heat exchangers are respectively referred to as elements 1350, 1450, 1550, 1650 and 1750. These various arrangements are depicted as additional exemplary embodiments of potential flow designs intended to be encompassed by this disclosure.

It will be appreciated that various of the above-disclosed features and functions, or alternatives thereof, may be desirably combined into different systems or applications. Also, various alternatives, modifications, variations or improvements may be subsequently made by those skilled in the art, and are also intended to be encompassed by the following claims. As such, various changes may be made without departing from the spirit and scope of this disclosure as defined in the claims.

What is claimed is:

1. A system for cooling an enclosed space, comprising:
   a plurality of air cooling devices, each air cooling device including an air-to-air heat exchanger and first and second air flow paths,
      the first air flow path including a first inlet through which outside air is drawn, a first segregated flow path through the air-to-air heat exchanger and an exhaust outlet through which the outside air heated in the air-to-air heat exchanger is exhausted outside each air cooling device as exhaust air, air flow through the first air flow path being driven by at least one scavenger air exhaust fan on an outlet side of the air-to-air heat exchanger in the first air flow path, and
      the second air flow path including a second inlet through which warm air from the enclosed space is drawn as return air, a second segregated flow path through the air-to-air heat exchanger and a supply outlet through which the return air, cooled in the air-to-air heat exchanger, is supplied back to the enclosed space as supply air at a temperature that facilitates cooling of the enclosed space, air flow through the second air flow path being driven by at least one recirculating air fan on an inlet side of the air-to-air heat exchanger in the second air flow path;
   at least one air filtering device that is a separate device from the plurality of air cooling devices, or is included in only a portion of the plurality of air cooling devices, and that filters only a portion of the return air from the enclosed space; and
   at least one ventilation air introducing device that is a separate device from the plurality of air cooling devices and the at least one air filtering device and that includes a heat pipe and at least one fan for introducing outside air into the ventilation air introducing device,
   wherein during operation of the ventilation air introducing device in a humidification mode, the outside air travels through a first section of the heat pipe and the return air travels through a second section of the heat pipe, and the outside air and return air having traveled through the heat pipe in the same direction are subsequently mixed in a mixing chamber before exiting as ventilation air.

2. The system for cooling the enclosed space according to claim 1, wherein the enclosed space is a computer data center including multiple computer data servers and ancillary support devices, and the supply air is circulated through the multiple computer data servers to extract the heat generated by the multiple computer data servers.

3. The system for cooling the enclosed apace according to claim 2, wherein the temperature at which the supply air is delivered back to the enclosed space is as required for optimal cooling and energy efficiency of the overall data center system.

4. The system for cooling the enclosed space according to claim 1, wherein the temperature at which the supply air is delivered back to the enclosed space is in a range of 64° F. to 81° F.

5. The system for cooling the enclosed space according to claim 1, wherein the plurality of air cooling devices provide a volumetric flow rate of the supply air to the enclosed space at a rate that is determined to dissipate the heat load with the operating temperature difference between the supply air and the return air, and the rate of flow results in 50 to over 200 volumetric air exchanges in the enclosed space per hour.

6. The system for cooling the enclosed space according to claim 1, wherein when the at least one air filtering device is a separate device, the at least one air filtering device includes a filtering fan and at least one air filter, and provides a volumetric flow rate that filters a portion of the air from the enclosed space at a rate of 6 to 10 volumetric air exchanges in the enclosed space per hour.

7. The system for cooling the enclosed space according to claim 1, wherein when the at least one air filtering device is included in only the portion of the plurality of air cooling devices, the at least one air filtering device includes a filtering fan that is one of the recirculating fans and at least one air filter, and the portion of the plurality of air cooling devices in which the at least one air filtering device is included is no more than twenty-five percent of the air cooling devices.

8. The system for cooling the enclosed space according to claim 1, wherein the at least one ventilation air introducing device delivers the ventilation air into the enclosed space at a flow rate of less than 1 volumetric air exchange in the enclosed space per hour.

9. The system for cooling the enclosed space according to claim 1, the at least one ventilation unit further comprising at least one recirculation air damper to facilitate a humidification process.

10. The system for cooling the enclosed space according to claim 1, wherein the air-to-air heat exchanger in each of the plurality of air cooling devices is at least one of a counter flow plate air-to-air heat exchanger, a polymer tube air-to-air heat exchanger, a heat pipe heat exchanger, or one comprised of multiple cross flow heat exchangers.

11. The system for cooling the enclosed space according to claim 1, wherein at least some of the plurality of air cooling devices further comprise an additional first cooling device in the first air flow path between the first inlet and an inlet side of the air-to-air heat exchanger.

12. The system for cooling the enclosed space according to claim 11, wherein the additional first cooling device is one of a direct evaporative cooler or a water spray directly onto scavenger side surfaces of the air-to-air heat exchanger.

13. The system for cooling the enclosed space according to claim 1, wherein at least some of the plurality of air cooling devices further comprise an additional second cooling device in the second air flow path between an outlet side of the air-to-air heat exchanger and the supply outlet.

14. The system for cooling the enclosed space according to claim 13, wherein the additional second cooling device is at least one of refrigeration cooling system or a chilled water coil.

15. The system for cooling the enclosed space according to claim 14, wherein the temperature at which the supply air is delivered back to the enclosed space is controlled by adjusting the air flow through the first air flow path and by staging and modulating refrigeration or chilled water based supplemental cooling, when required, in the additional second cooling device.

16. The system for cooling the enclosed space according to claim 15, wherein the at least one scavenger exhaust fan is a variable speed fan, and the air flow through the first air flow path is adjusted by varying the speed of the at least one variable speed exhaust fan.

17. The system for cooling the enclosed space according to claim 15, wherein when the at least one scavenger exhaust fan is a plurality of scavenger exhaust fans, and the air flow through the first air flow path is adjusted by cycling on and off at least one of the plurality of scavenger exhaust fans to achieve optimal efficiency in concert with modulating the speed of at least one other of the plurality of scavenger exhaust fans operating to reject the heat.

18. The system for cooling the enclosed space according to claim 1, wherein the supply air flow is adjusted using at least one control algorithm based on at least one sensed control variable.

* * * * *